United States Patent [19]

Nomura et al.

[11] Patent Number: 5,742,850
[45] Date of Patent: Apr. 21, 1998

[54] LENS SHUTTER TYPE OF CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,602

[22] Filed: Jan. 9, 1997

[30] Foreign Application Priority Data

Jan. 26, 1996 [JP] Japan ................... 8-012317
Feb. 22, 1996 [JP] Japan ................... 8-034824

[51] Int. Cl.$^6$ ................................................ G03B 17/00
[52] U.S. Cl. ........................ 396/72; 396/85; 359/696; 359/700; 359/704
[58] Field of Search ..................... 396/72, 85, 87, 396/529; 359/696, 699, 700, 701, 704

[56] References Cited

U.S. PATENT DOCUMENTS

| | | | |
|---|---|---|---|
| 5,255,124 | 10/1993 | Iwamura | 359/700 |
| 5,262,898 | 11/1993 | Nomura | 359/700 |
| 5,349,408 | 9/1994 | Nomura et al. | |
| 5,386,740 | 2/1995 | Nomura et al. | 359/704 |
| 5,535,057 | 7/1996 | Nomura et al. | 396/72 |
| 5,543,971 | 8/1996 | Nomura et al. | 359/700 |
| 5,581,411 | 12/1996 | Nomura et al. | 359/704 |
| 5,592,250 | 1/1997 | Shimizu | |
| 5,604,638 | 2/1997 | Nomura et al. | 359/704 |
| 5,636,064 | 6/1997 | Nomura et al. | 359/704 |
| 5,652,922 | 7/1997 | Kohno | 396/72 |
| 5,659,810 | 8/1997 | Nomura et al. | 396/72 |
| 5,661,609 | 8/1997 | Nomura et al. | 359/700 |

OTHER PUBLICATIONS

A United Kingdom Search Report issued with UK Application No. 9701482.3.

*Primary Examiner*—Russell E. Adams
*Attorney, Agent, or Firm*—Greenblum & Bernstein P.L.C.

[57] ABSTRACT

A lens drive mechanism is disclosed that includes: a shutter block which supports a lens shutter including a plurality of shutter blades; a lens group guided along an optical axis thereof relative to the shutter block; a first motor secured to the shutter block for opening or closing the lens shutter; a second motor secured to the shutter block for moving the lens group along the optical axis; a first encoder for detecting a size of a diaphragm formed by the lens shutter; a second encoder for detecting an axial position of the lens group; a shutter driving gear train which connects the lens shutter with the first motor; a first encoder gear train which connects the first encoder with the first motor, the shutter driving gear train and the first encoder gear train being supported on the shutter block and arranged along a circumferential direction of the shutter block with a driving pinion of the first motor being positioned between the shutter driving gear train and the first encoder gear train; a lens driving gear train which connects the lens group with the second motor; and a second encoder gear train which connects the second encoder with the second motor, the lens driving gear train and the second encoder gear train being supported on the shutter block and arranged along the circumferential direction of the shutter block with a driving pinion of the second motor being positioned between the lens driving gear train and the second encoder gear train.

19 Claims, 31 Drawing Sheets

LENS SHUTTER TYPE OF CAMERA

BACKGROUND OF THE INVENTION

1. Field of the Invention

The present invention relates to a lens shutter type of camera in which a lens shutter is driven by a motor and a lens group is driven by another motor to move relative to the lens shutter along an optical axis thereof.

2. Description of the Related Art

A lens shutter type of camera in which a zoom lens is driven in accordance with a new focusing method has been proposed in U.S. patent application Ser. No. 08/653,369 (filed on Jul. 5, 1996). Such a lens shutter type of camera includes: a photographic lens consisting of front and rear lens groups; a whole optical unit driving motor for moving the front and rear lens groups together as a whole along an optical axis thereof; a lens group driving motor for moving the rear lens group (or front lens group) along the optical axis relative to the front lens group (or rear lens group); a zoom operating device for determining a focal length of the photographic lens; and, a focus operating device for actuating both the whole optical unit driving motor and the lens group driving motor to perform a focusing operation. In this lens shutter type of camera, the focal length of the photographic lens is selectively and manually determined by the zoom operating device, and the whole optical unit driving motor and the lens group driving motor are simultaneously driven to bring a subject to be photographed into an in-focus condition upon the focus operating device being operated.

SUMMARY OF THE INVENTION

An object of the present invention is to provide a lens shutter type of camera having a zoom lens driven in accordance with the aforementioned new focusing method, which is provided with a preferred driving mechanism for driving the lens shutter, the front or rear lens group, etc. which does not consume much space in the zoom lens.

To achieve the object mentioned above, according to an aspect of the present invention, there is provided a lens drive mechanism including: a shutter block which supports a lens shutter including a plurality of shutter blades; a lens group guided along an optical axis thereof relative to the shutter block; a first motor secured to the shutter block for opening or closing the lens shutter; a second motor secured to the shutter block for moving the lens group along the optical axis; a first encoder for detecting a size of a diaphragm formed by the lens shutter; a second encoder for detecting an axial position of the lens group; a shutter driving gear train which connects the lens shutter with the first motor; a first encoder gear train which connects the first encoder with the first motor, the shutter driving gear train and the first encoder gear train being supported on the shutter block and arranged along a circumferential direction of the shutter block with a driving pinion of the first motor being positioned between the shutter driving gear train and the first encoder gear train; a lens driving gear train which connects the lens group with the second motor; and a second encoder gear train which connects the second encoder with the second motor, the lens driving gear train and the second encoder gear train being supported on the shutter block and arranged along the circumferential direction of the shutter block with a driving pinion of the second motor being positioned between the lens driving gear train and the second encoder gear train.

Preferably, the first encoder and the second encoder are positioned adjacent to each other.

Preferably, the first encoder includes a first photosensor and a first rotating disk associated with the first photosensor, and wherein the second encoder includes a second photosensor and a second rotating disk associated with the second photosensor.

Preferably, each of the first and second photosensors is a photointerrupter, and each of the first and second rotating disks is provided with a plurality of slits.

Preferably, the first rotating disk and the second rotating disk are positioned adjacent to each other between the first motor and the second motor.

Preferably, the first and second encoders are positioned to overlap as viewed in the direction of the optical axis.

According to another aspect of the present invention, there is provided a lens shutter type of camera including: a shutter block which supports a lens shutter; a lens group guided along an optical axis thereof relative to the shutter block; a first motor secured to the shutter block for opening or closing the lens shutter; a second motor secured to the shutter block for moving the lens group along the optical axis; a shutter driving gear train which connects the lens shutter with the first motor; a lens driving gear train which connects the lens group with the second motor; a lens barrier for opening or closing a frontmost photographic aperture of the photographic lens; and a barrier driving gear train which connects the lens driving gear train with the lens barrier, wherein the shutter driving gear train, the lens driving gear train and the barrier driving gear train are all supported on the shutter block and arranged along a circumferential direction of the shutter block, and wherein the barrier driving gear train and the shutter driving gear train overlap each other as viewed in a direction of the optical axis.

According to yet another aspect of the present invention, there is provided a lens shutter type of camera including: a shutter block which supports a lens shutter including a plurality of shutter blades; a lens group guided along an optical axis thereof relative to the shutter block; a first motor secured to the shutter block for opening or closing the lens shutter; a second motor secured to the shutter block for moving the lens group along the optical axis; a first encoder for detecting a size of a diaphragm formed by the lens shutter; and a second encoder for detecting an axial position of the lens group, wherein the first encoder and the second encoder are positioned adjacent to each other between the first motor and the second motor.

According to yet another aspect of the present invention, there is provided a photographic zoom lens having: a moving barrel advanced from or retracted into a stationary block of the photographic zoom lens; front and rear lens groups positioned in the moving barrel; and a unit fixed to the moving barrel therein that is assembled separately from the moving barrel, wherein the unit includes.: a lens shutter having a plurality of shutter blades; a rear lens group supporting member which supports the rear lens group to be guided along an optical axis thereof relative to the front lens group; a first motor for opening or closing the lens shutter; a second motor for moving the rear lens group supporting member along the optical axis; a first encoder for detecting a size of a diaphragm formed by the lens shutter, the first encoder including a first photosensor and a first rotating disk associated with the first photosensor; a second encoder for detecting an axial position of the rear lens group, the second encoder including a second photosensor and a second rotating disk associated with the second photosensor; a shutter driving gear train which connects the lens shutter with the first motor; a first encoder gear train which connects the first rotating disk with the first motor, the shutter driving gear train and the first encoder gear train being supported on the unit and arranged along a circumferential direction of the unit with a driving pinion of the first motor being positioned between the shutter driving gear train and the first encoder gear train; a lens driving gear train which connects the rear lens group with the second motor; a second encoder gear train which connects the second rotating disk with the second motor, the lens driving gear train and the second encoder gear train being supported on the unit and arranged along the circumferential direction of the unit with a driving pinion of the second motor being positioned between the lens driving gear train and the second encoder gear train; a lens barrier including a plurality of barrier blades for opening or closing a frontmost photographic aperture of the photographic lens; and a barrier driving gear train which connects the lens driving gear train with the lens barrier, the barrier driving gear train being supported on the shutter block and arranged along the circumferential direction of the shutter block, wherein the barrier driving gear train and the shutter driving gear train overlap each other as viewed in a direction of the optical axis.

The present disclosure relates to subject matter contained in Japanese Patent Applications No. 8-12317 (filed on Jan. 26, 1996) and No: 28-34824 (filed on Feb. 22, 1996) which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein.

DESCRIPTION OF THE PREFERRED EMBODIMENT

Figure 27:
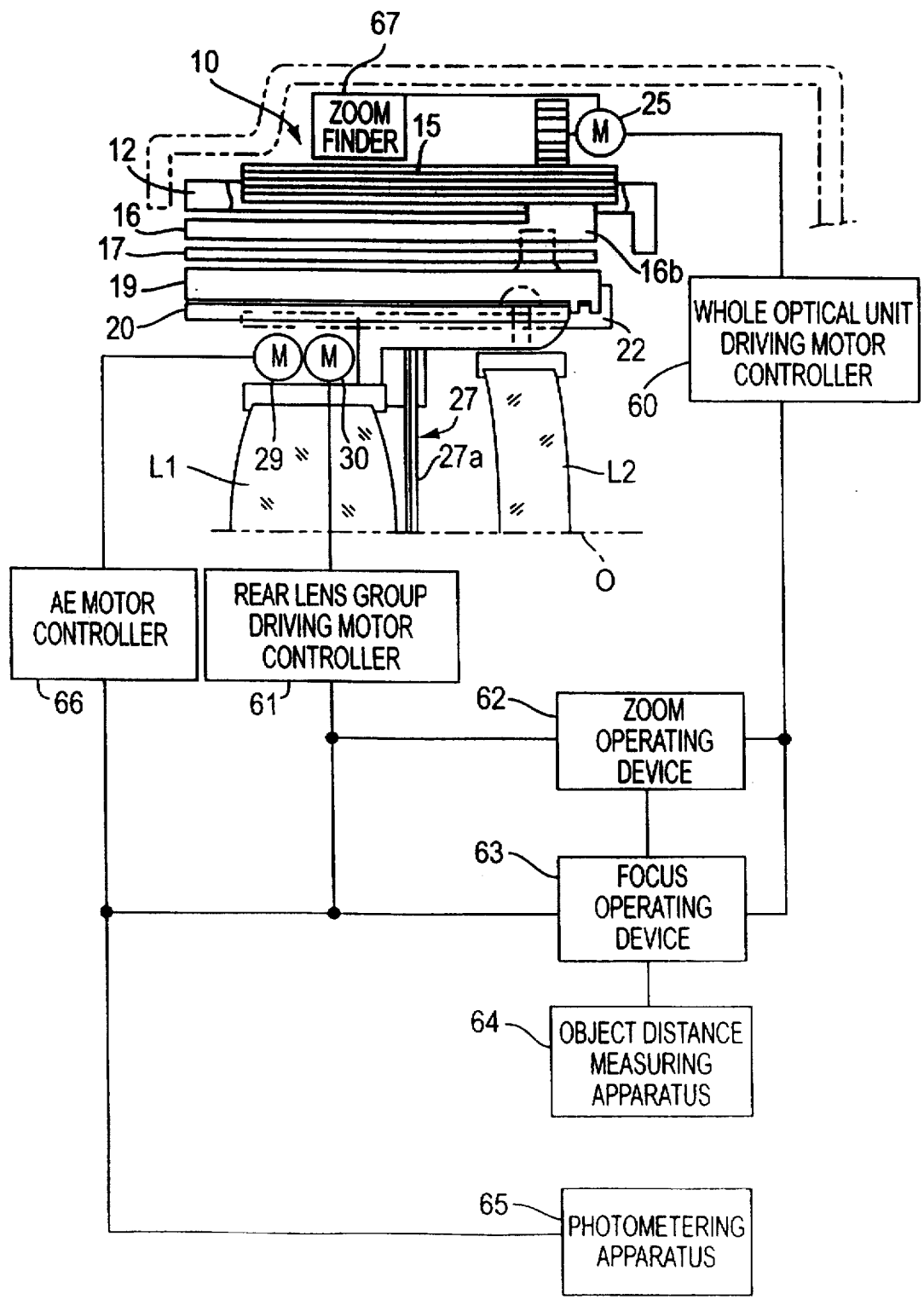
FIG. 27 is a block diagram of a controlling system for controlling an operation of the zoom lens barrel.

FIG. 27 is a schematic representation of various elements which comprise a preferred embodiment of a zoom lens camera to which the present invention is applied. A concept of the present zoom lens camera will now be described with reference to FIG. 27.

The zoom lens camera is provided with a zoom lens barrel (zoom lens) 10 of a three-stage delivery type (telescoping type) having three moving barrels, namely a first moving barrel 20, a second moving barrel 19 and a third moving barrel 16, which are concentrically arranged in this order from an optical axis O. In the zoom lens barrel 10 two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in sequence with the variation of the focal length through the operation of the zoom operating device 62. Therefore, the photographer can perceive the variation of the focal length by observing the variation of image magnification of the visual field of the finder. In addition, the focal length, set by the operation of the zoom operating device 62, may be perceived by a value indicated on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. Due to the driving of the whole optical unit driving motor controller 60 and the rear lens group driving motor controller 61, the front and rear lens groups L1 and L2 are moved to respective positions corresponding to a set focal length and a detected object distance and thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 causes the photometering switch to be turned ON, and the object distance measuring and photometering commands are respectively input to the object distance measuring apparatus 64 and the photometering apparatus 65.

When the release button is fully depressed (full step), the focus operating device 63 causes the release switch to be turned ON, and according to the result of object distance measuring demand and a set focal length, the whole optical unit driving motor 25 and the rear lens group driving motor 30 are driven, and the focusing operation, in which the front lens group L1 and the rear lens group L2 move to the focusing position, is executed. Further, an AE motor 29 of an AF/AE (i.e., autofocus/autoexposure) shutter unit (electrical unit) 21 (FIG. 23) is driven via the AE motor controller 66 to actuate a shutter (lens shutter) 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole in the direction of the optical axis O (optical axis direction). Simultaneous with such a movement, the rear lens group driving motor 30 may also be driven via the rear lens group driving motor controller 61 to move the rear lens group L2 relative to the front lens group L1. However, this is not performed under the conventional concept of zooming in which the focal length is varied sequentially without moving the position of the focal point. When the zoom operating device 62 is operated, the following two modes are available, namely:

1. a mode to move the front lens group L1 and the rear lens group L2 in the optical axis direction without varying the distance therebetween by driving only the whole optical unit driving motor 25; and,
2. a mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, this is not a problem in a lens-shutter type camera, since the image of the subject is not observed through the photographing optical system, but through the finder optical system that is provided separate from the photographing optical system, and it is sufficient to only be focused when the shutter is released. In mode 2, during a zooming operation, the front lens group L1 and the rear lens group L2 are moved without regard to whether the focal point moves, and when the shutter is released, the focusing operation (focus, adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined not only using subject distance information provided from the object distance measuring apparatus 64, but also by using focal length information set by the zoom operating device 62. In such a manner, when the focus operating device 63 is operated, by moving both the whole optical unit driving motor 25 and the rear lens group driving motor 30, the position of the lens groups L1, L2 can be flexibly controlled, as compared with lens movements controlled by cam.

The zoom lens camera of this embodiment can also be controlled in a different manner such that, during an operation of the zoom operating device 62, only the magnification of the zoom finder 67 and the focal length information are varied without driving either the whole optical unit driving motor 25 or the rear lens group driving motor 30. When the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 25 and 26.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 25:
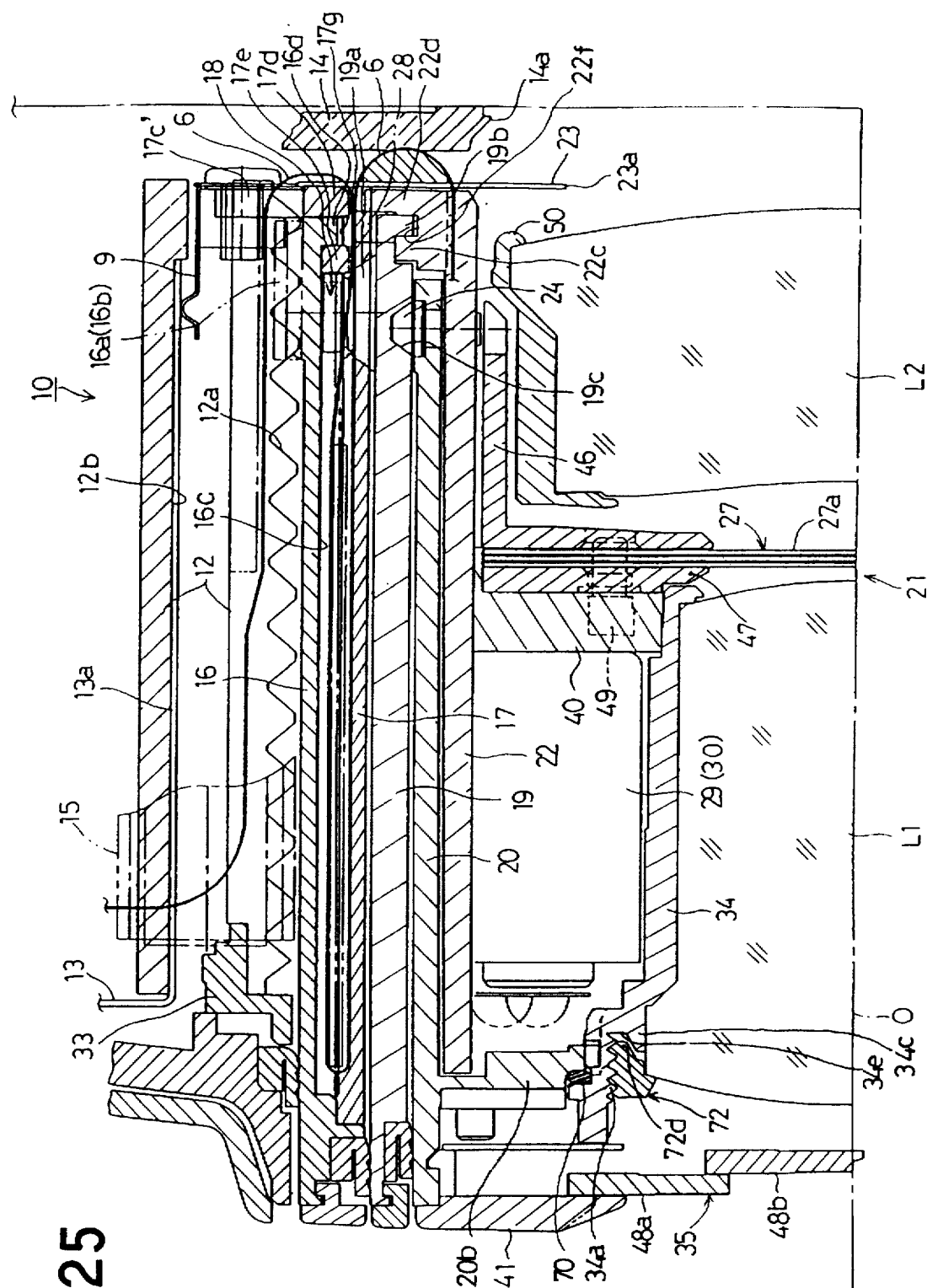
FIG. 25 is a sectional view of an upper part of the zoom lens barrel in the housed state.

An O-ring 70, made of a rubber or the like, is positioned between an outer peripheral circumferential surface of the lens supporting barrel 34, in the vicinity of the front end thereof, and an inner peripheral circumferential surface of an inner flange portion 20b formed integral with the first moving barrel 20 in the vicinity of the front end thereof, as shown in FIG. 25. The O-ring 70 prevents water from penetrating the zoom lens barrel 10 at the front end thereof between the first moving barrel 20 and the lens supporting barrel 34.

Figure 29:
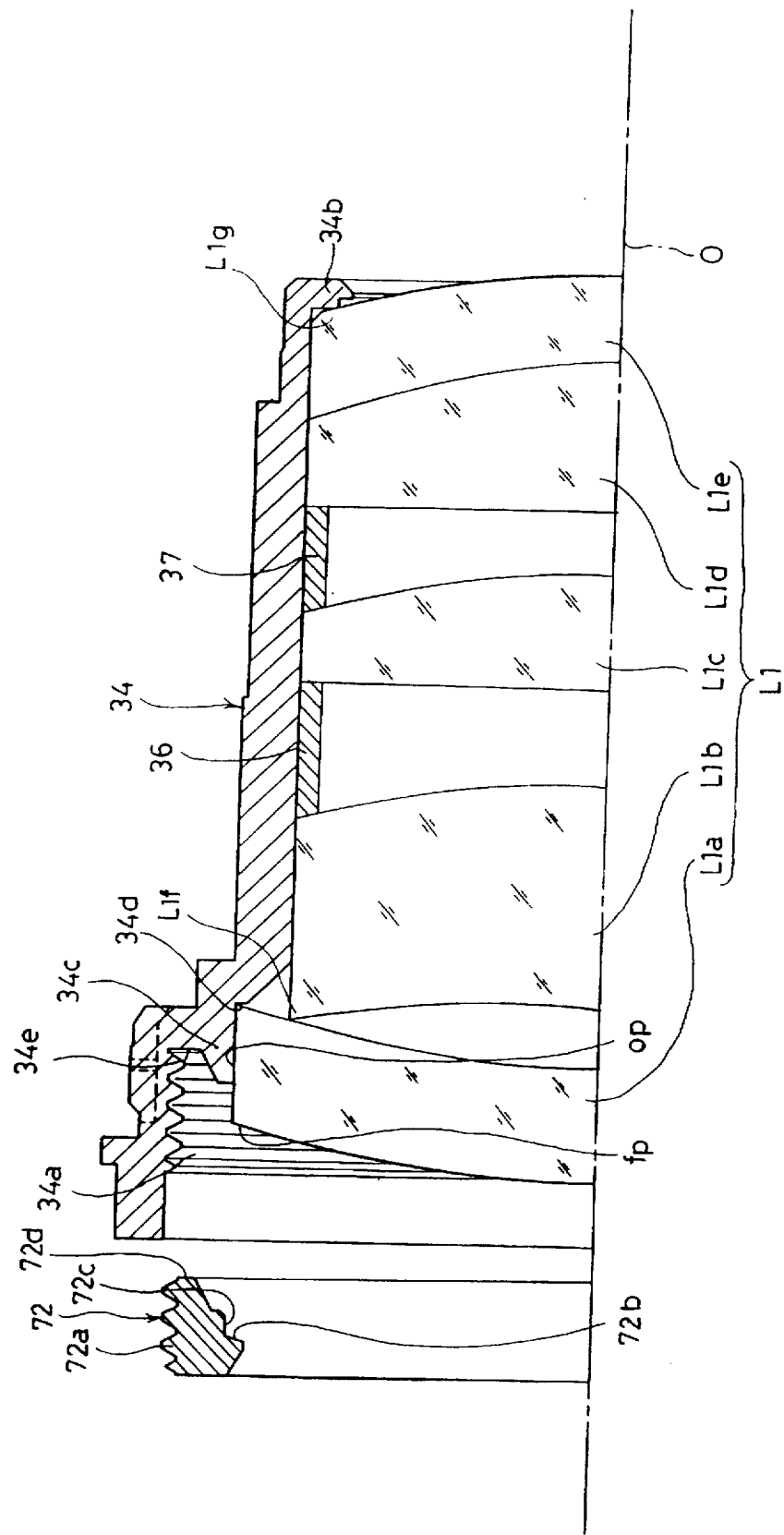
FIG. 29 is a sectional view of an upper part of a lens supporting barrel which supports a front lens group therein, and a lens fixing ring which is to be screw-engaged with the lens supporting barrel.

As shown in FIG. 29, the front lens group L1 consists of five lenses, namely, a first lens (frontmost lens) L1a, a second lens L1b, a third lens L1c, a fourth lens L1d and a fifth lens L1e in this order from an object Side to an image side, i.e., from the left hand side to the right hand side as viewed in FIG. 29.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 30:
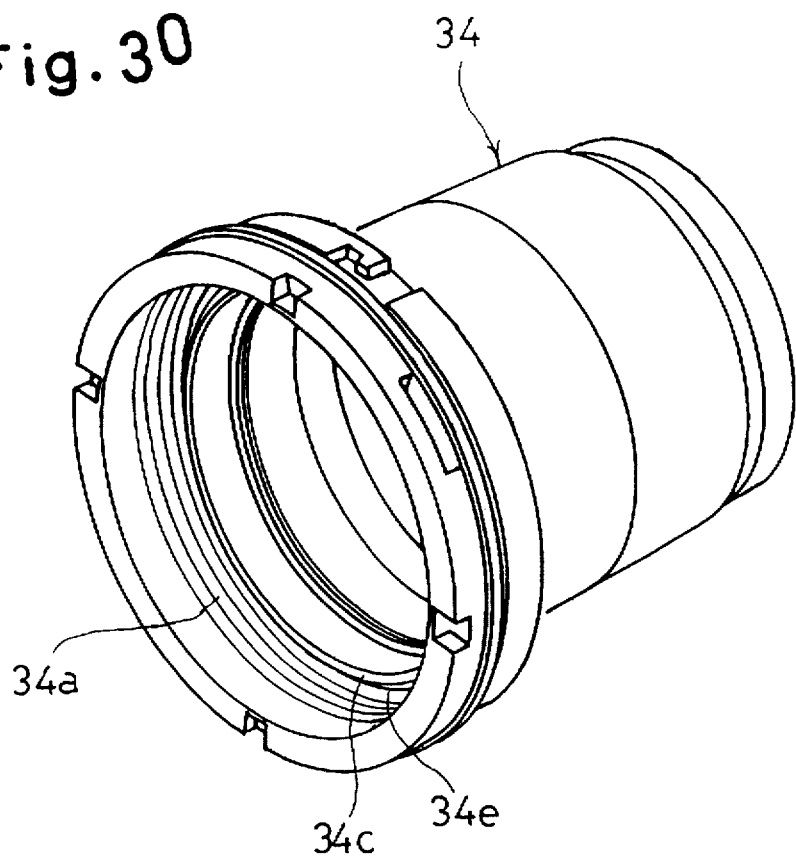
FIG. 30 is an enlarged perspective view of the lens supporting barrel shown in FIG. 29.

A female thread 34a is formed on an inner periphery of a front part of the lens supporting barrel 34, as shown in FIGS. 29 or 30. A lens fixing ring 72, for fixing the first lens L1a to the lens supporting barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface thereof. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is formed integral with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis O, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis O.

Figure 31:
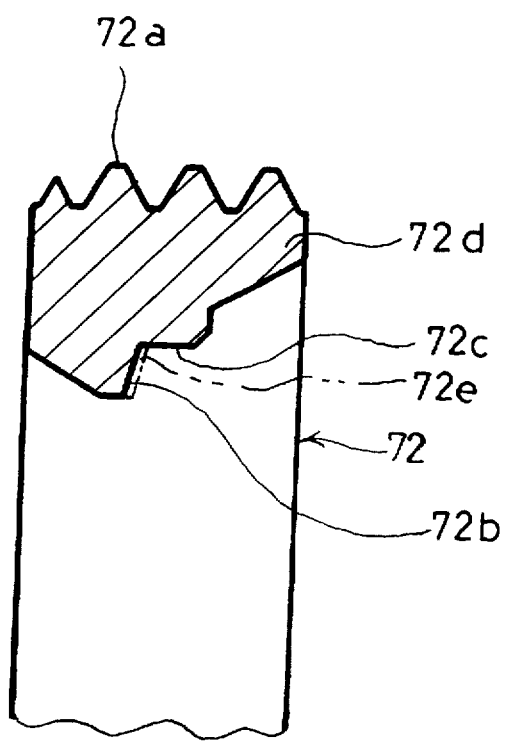
FIG. 31 is an enlarged sectional view of a part of the lens fixing ring shown in FIG. 29.

As shown in FIG. 31, a coating 72e is coated on the circular abutting surface 72b. The coating 72e is a waterproof coating made of a synthetic resin. In the present embodiment, "Fantas Coat SF-6 (trademark of a coating produced by the Japanese Company "Origin Denki Kabushiki Kaisha")" is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Due to this fact, were it not for the coating 72e on the circular abutting surface 72b, a substantial gap would be formed between the circular abutting surface 72b and the circumferential portion fp even if the circular abutting surface 72b properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which does not cause to form such a substantial gap between the circular abutting surface 72b and the circumferential portion fp when the circular abutting surface 72b properly contacts the circumferential portion fp. Accordingly, the coating 72e positioned and held between the circular abutting surface 72b and the circumferential portion fp, effectively prevents water or moisture from penetrating the lens supporting barrel 34 between the circular abutting surface 72b and the circumferential portion fp under the condition that the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 25, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e, namely, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided, on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 21:
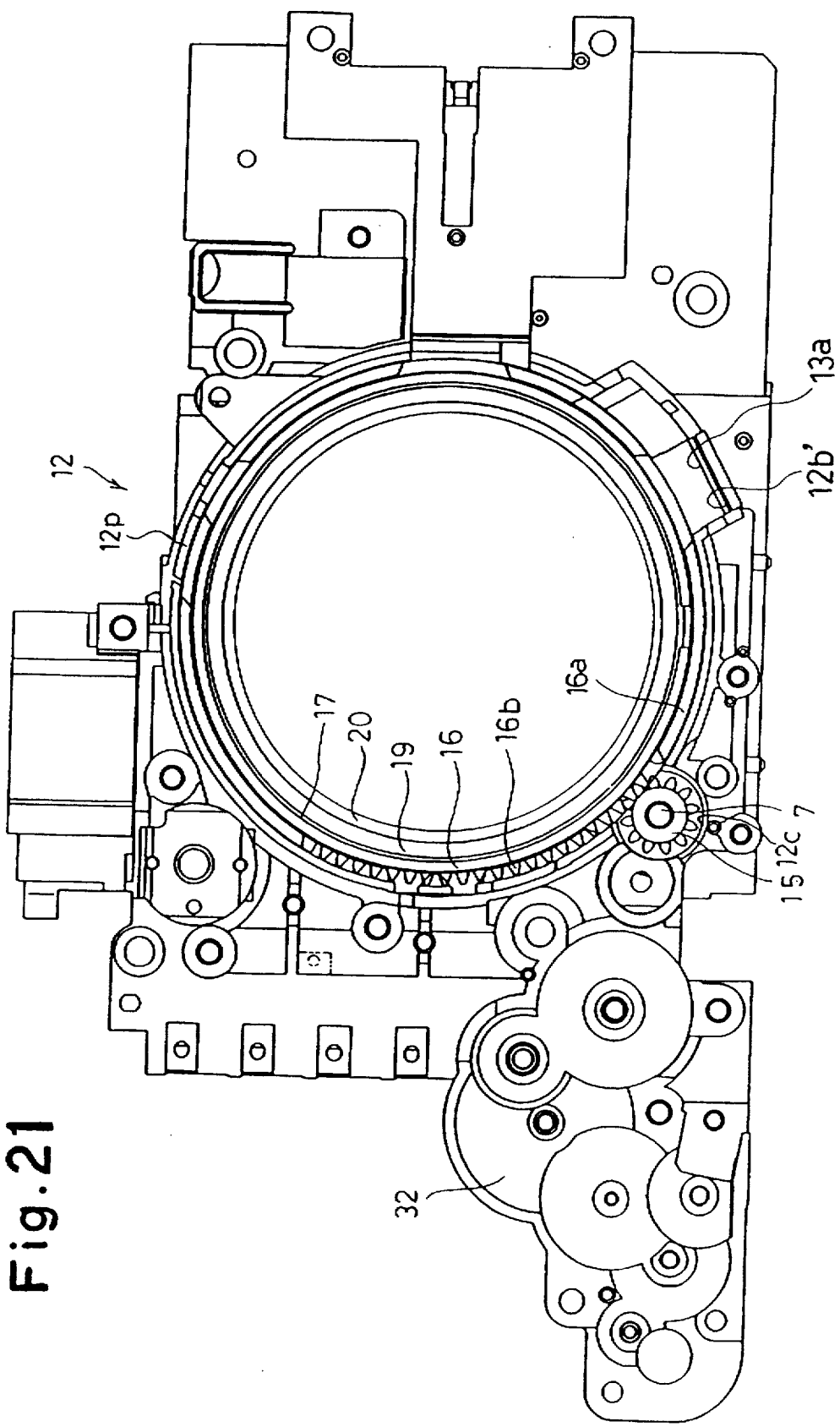
FIG. 21 is a front elevational view of a fixed lens barrel block of the zoom lens barrel.
Figure 26:
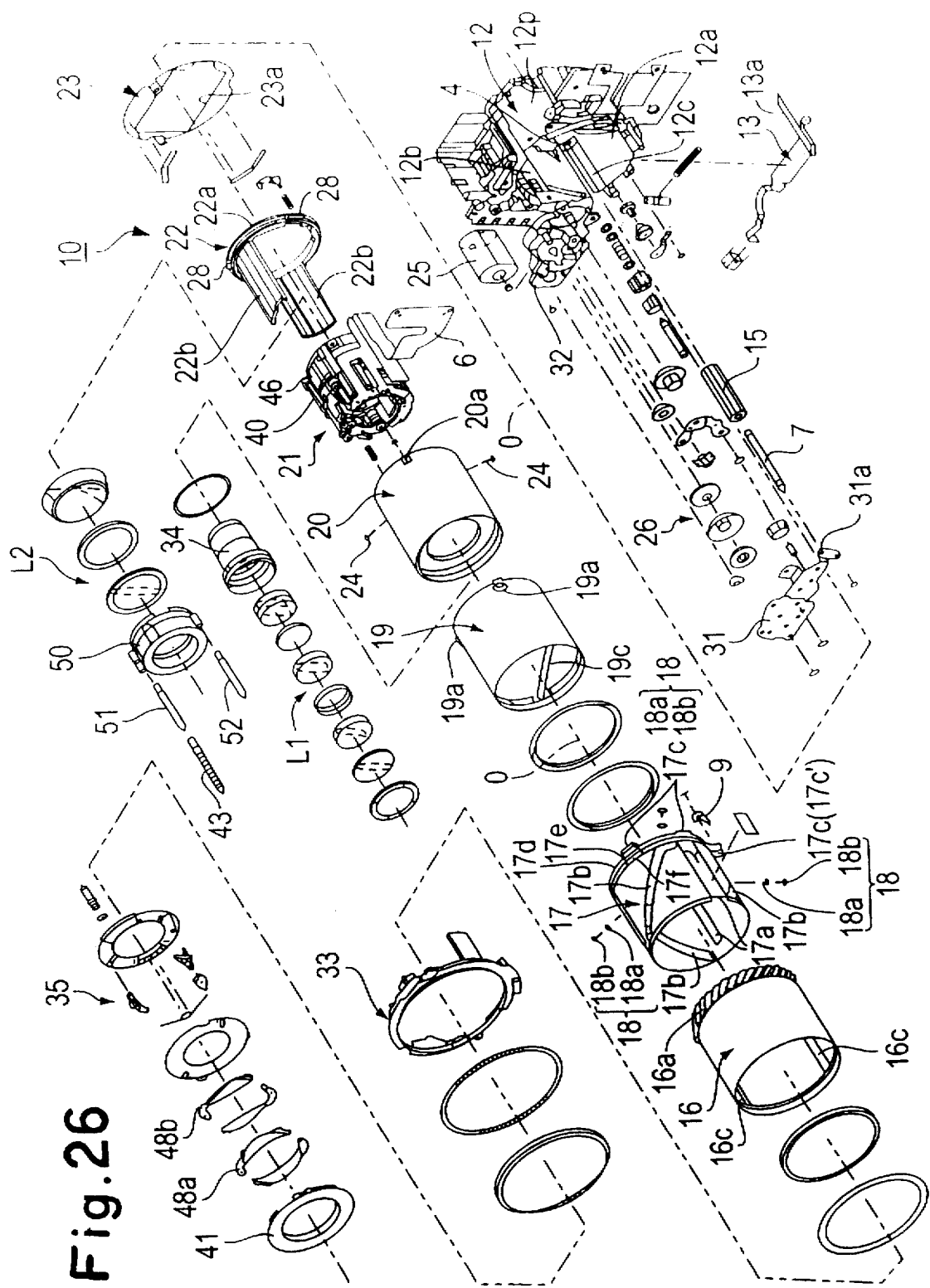
FIG. 26 is an exploded perspective view of the overall structure of the zoom lens barrel.

In the fixed lens barrel block 12, a gear housing 12c, which is recessed outwardly from an inner periphery of the cylindrical portion 12p of the fixed lens barrel block 12 in a radial direction while extending in the optical axis direction, is provided as shown in FIGS. 21 or 26. In the gear housing 12c, a driving pinion 15, extending in the optical axis direction, is rotatably held. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 21.

Figure 20:
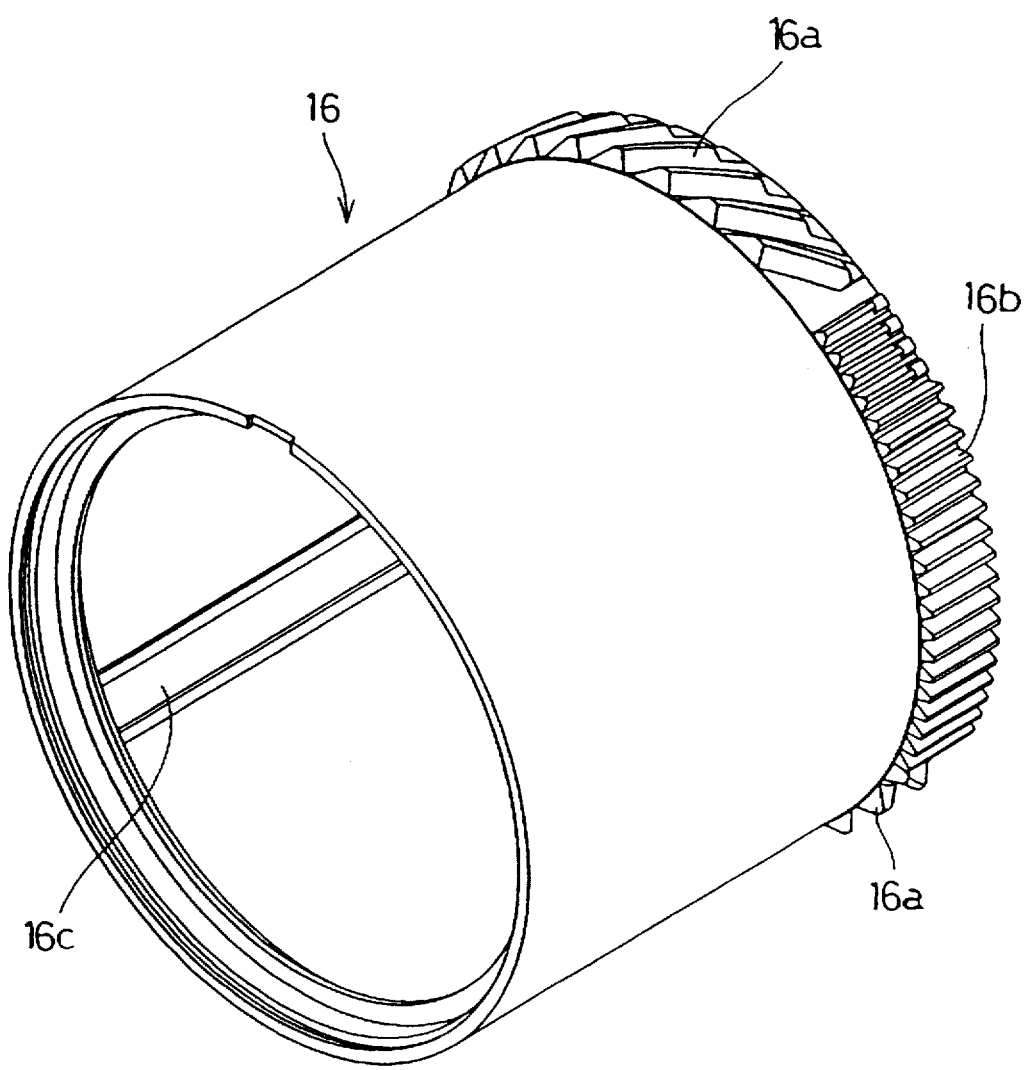
FIG. 20 is an enlarged schematic perspective view of a third moving barrel of the zoom lens barrel.

On an inner periphery of the third moving barrel 16, a plurality of linear guide grooves 16c, each extending parallel to the optical axis O, are formed. At an outer periphery of the rear end of the third moving barrel 16, a male helicoid 16a and the aforementioned outer peripheral gear 16b are provided as shown in FIG. 20. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 28:
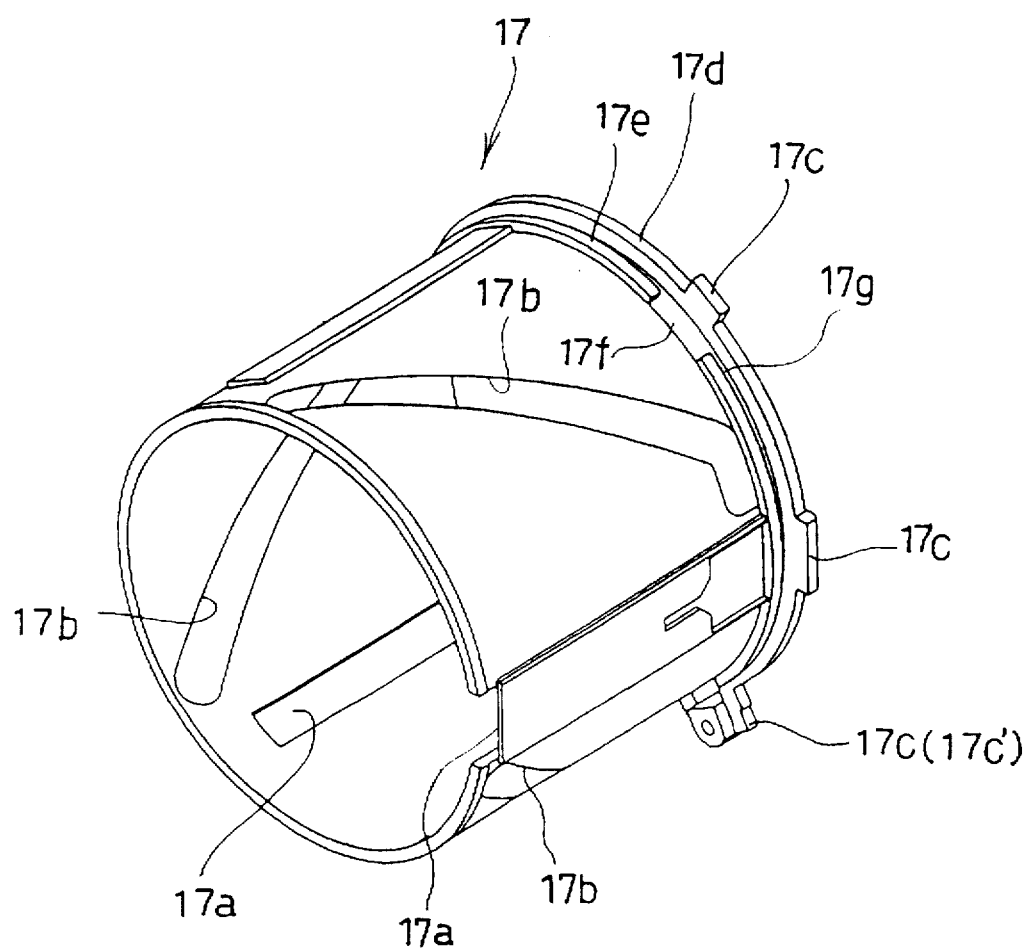
FIG. 28 is an enlarged perspective view of a linear guide barrel shown in FIG. 26.

As shown in FIG. 28, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided, in front of the rear end flange 17d, with a retaining flange 17e. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 25.

The third moving barrel 16 is provided, on an inner periphery of the rear end thereof, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 25). By rotating the third moving barrel 16 relative to the linear guide barrel 17, the engaging projections 16d are engaged with the linear guide barrel 17.

On the rear end of the linear guide barrel 17, an aperture plate 23 having a rectangular-shaped aperture 23a approximately the same shape as the aperture 14a, is fixed.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIGS. 26 or 28. The lead slots 17b are each formed oblique (inclined) to the optical axis O.

The second moving barrel 19 engages with the inner periphery of the linear guide barrel 17. On the inner periphery of the second moving barrel 19, a plurality of lead grooves 19c are provided in a direction inclined oppositely to the lead slots 17b. On the outer periphery of the rear end of the second moving barrel 19 a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c, and at the same time the first moving barrel 20 is guided linearly by a linear guide member 22. The first moving barrel 20 is provided at the front end thereof with a decorative plate 41 secured thereto.

Figure 16:
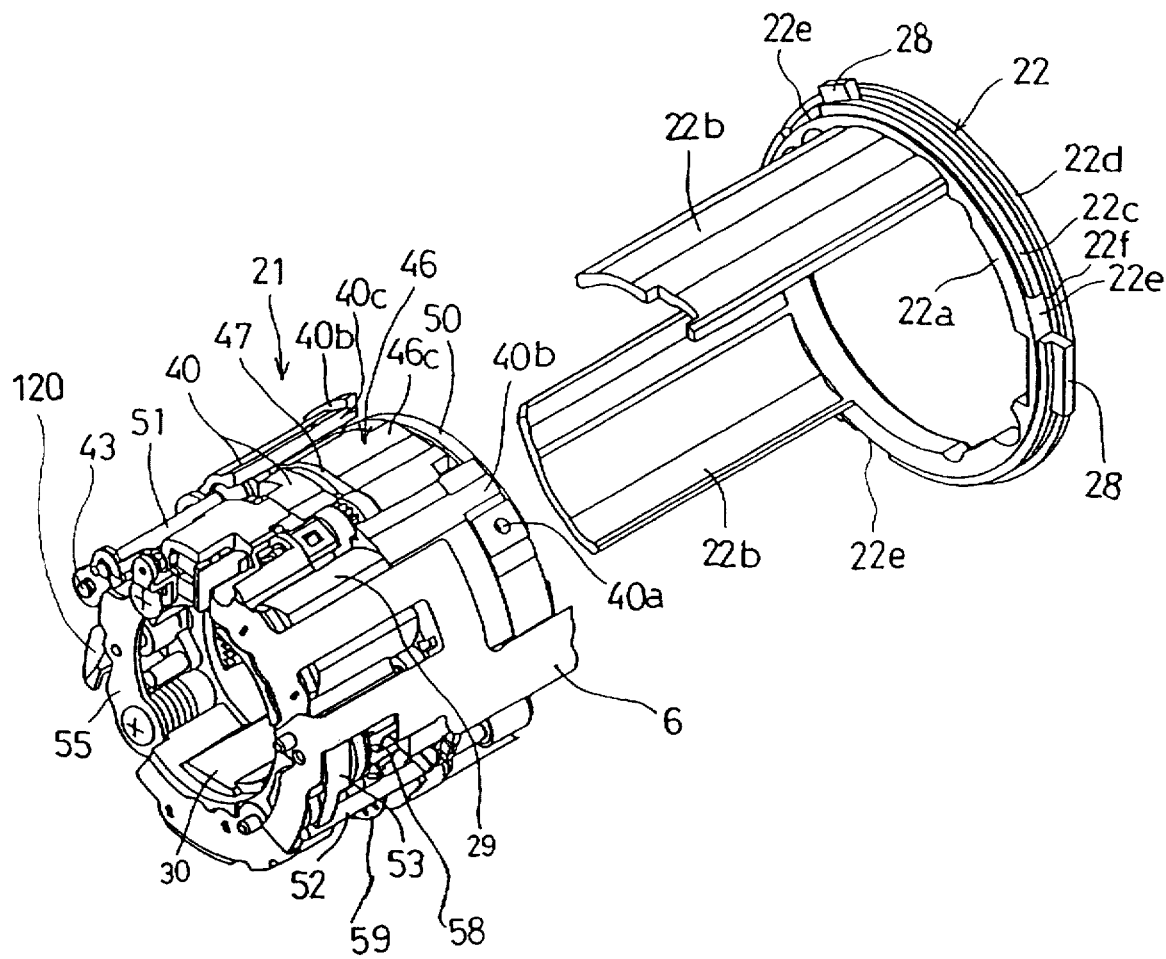
FIG. 16 (is an enlarged schematic perspective view showing a part the zoom lens barrel.
Figure 17:
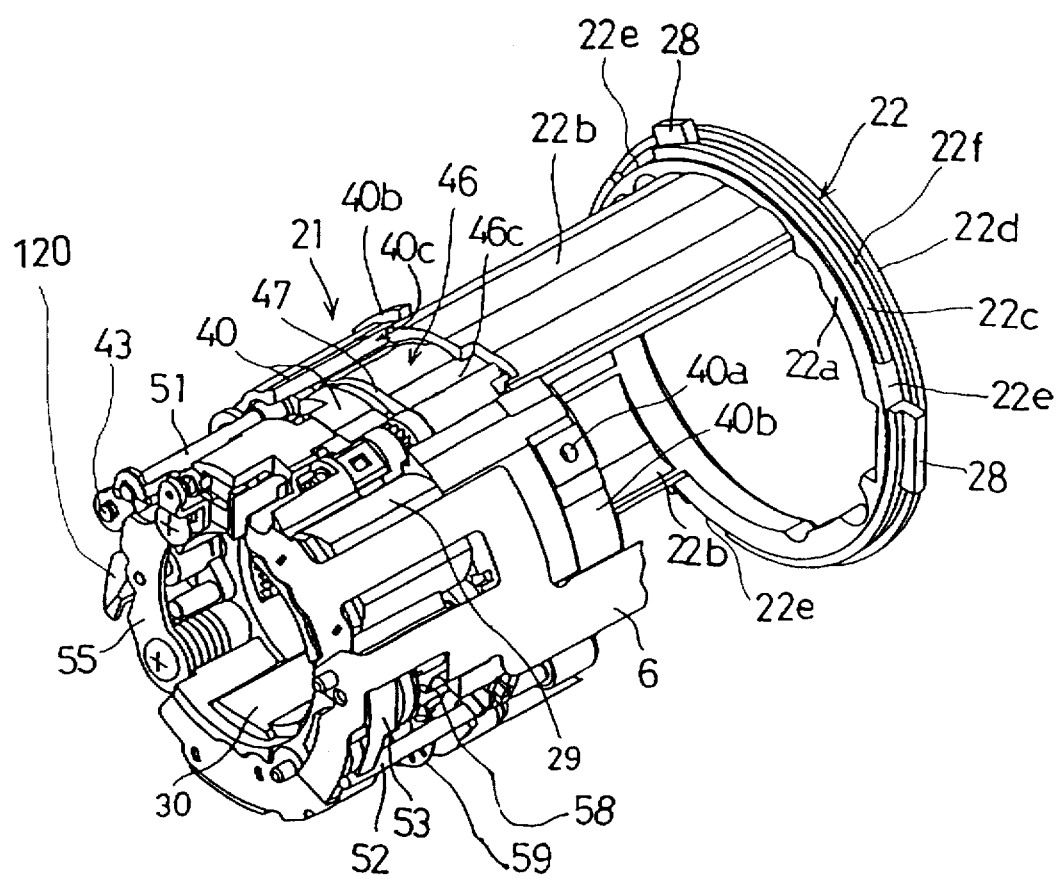
FIG. 17 is schematic perspective view showing the part of the zoom lens barrel shown in FIG. 16 in an engaged state.
Figure 18:
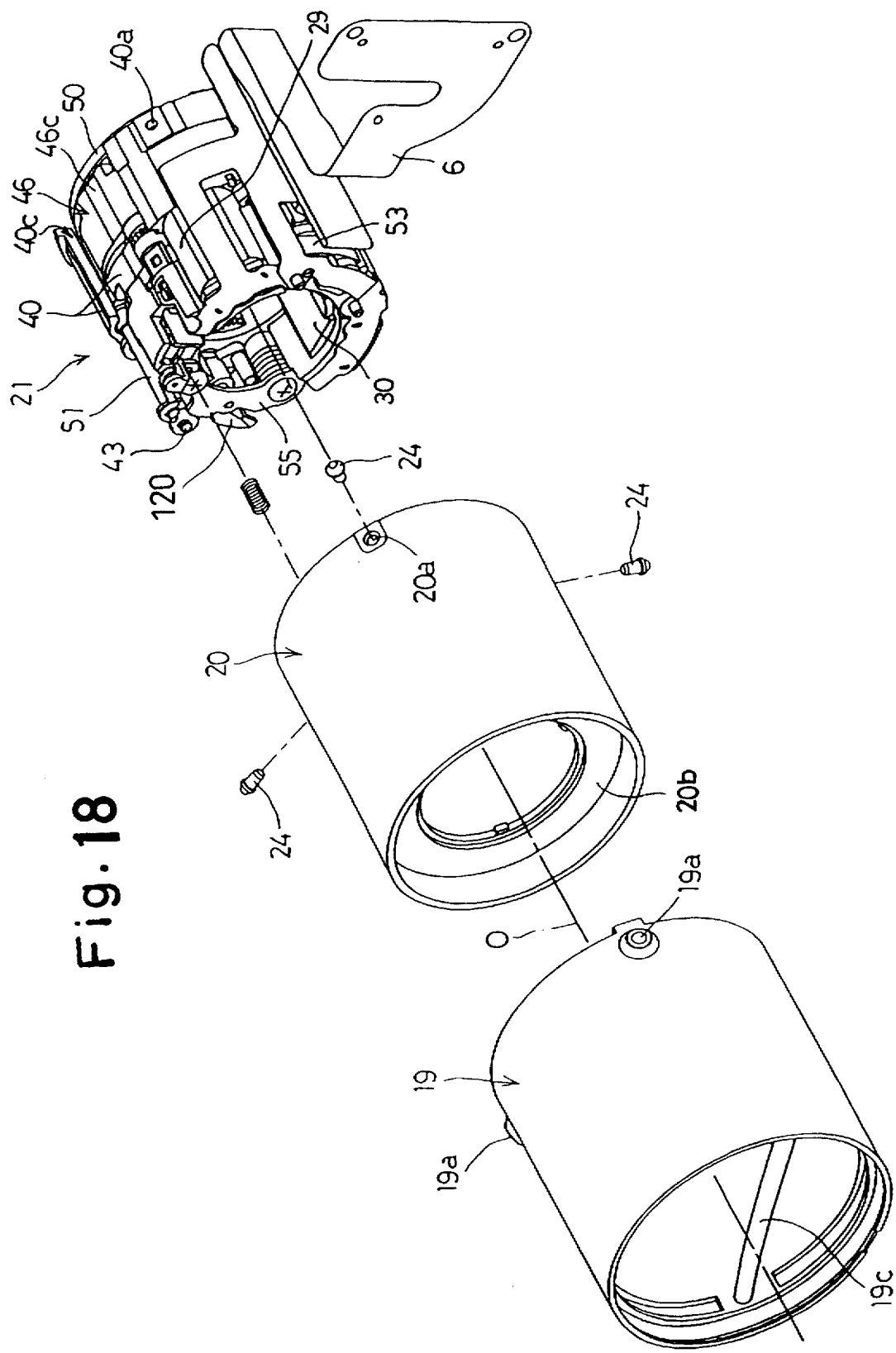
FIG. 18 (is an enlarged exploded perspective view of a part of the zoom lens barrel.

As shown in FIGS. 16 and 17, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis O as a whole, and in addition are capable of relatively rotating, around the optical axis O. The linear guide member 22 is further provided on the outer periphery of the rear end thereof with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a radius smaller than the rear end flange 22d. The retaining flange 22c is provided with a plurality of cutout portions 22e, as shown in FIGS. 16 or 17, each allowing a corresponding engaging projection 19b to be inserted into the circumferential groove 22f, as shown in FIG. 25.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly, forwardly or rearwardly along the optical axis O, but is restricted from rotating.

Figure 23:
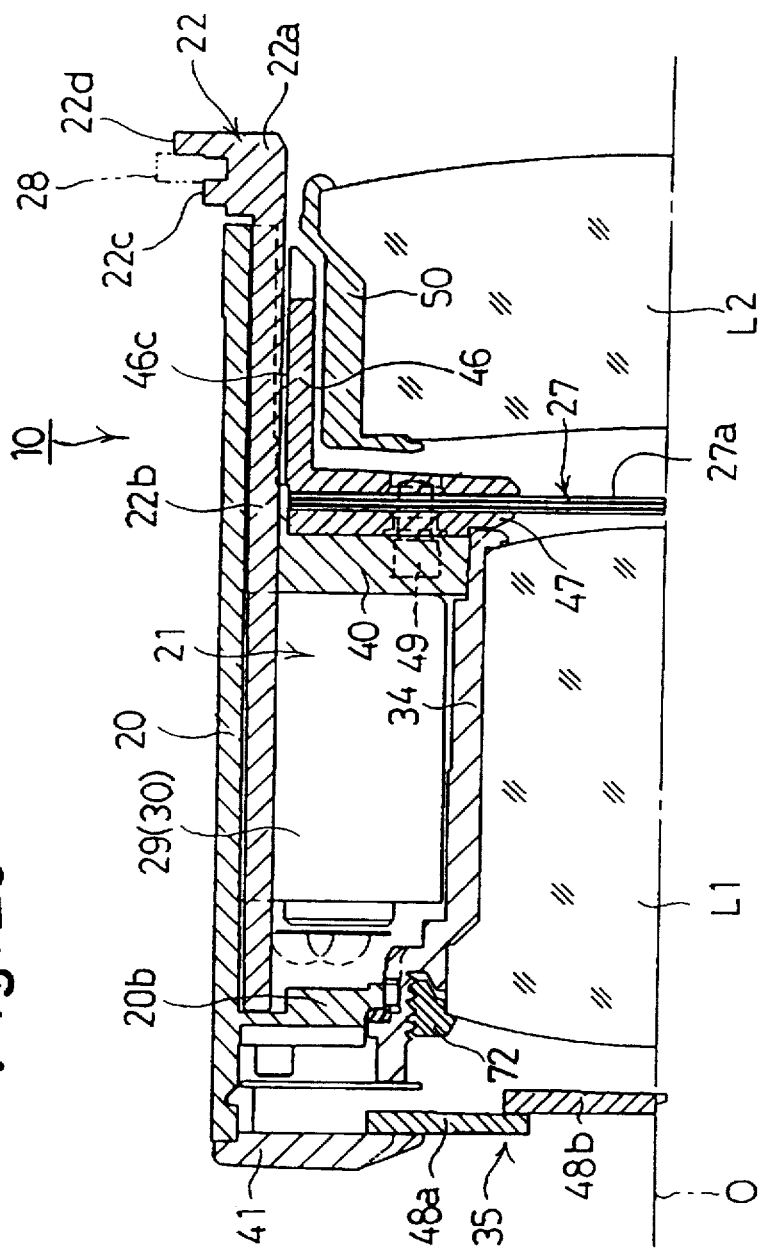
FIG. 23 a sectional view of an upper part of the zoom lens barrel, illustrating essential elements in a housed state is

At the front of the first moving barrel 20, a barrier apparatus 35 having barrier blades 48a and 48b is mounted. On an inner peripheral face of the first moving barrel 20 the AF/AE shutter unit 21 having the shutter 27, consisting of three shutter blades 27a, is engaged and fixed, as shown in FIG. 23. The AF/AE shutter unit 21 is provided with a plurality of fixing holes 40a formed at even angular intervals on the outer periphery of the shutter mounting stage 40. Only one of the fixing holes 40a appears in each of FIGS. 1, 16, 17, 18 and 19.

Figure 19:
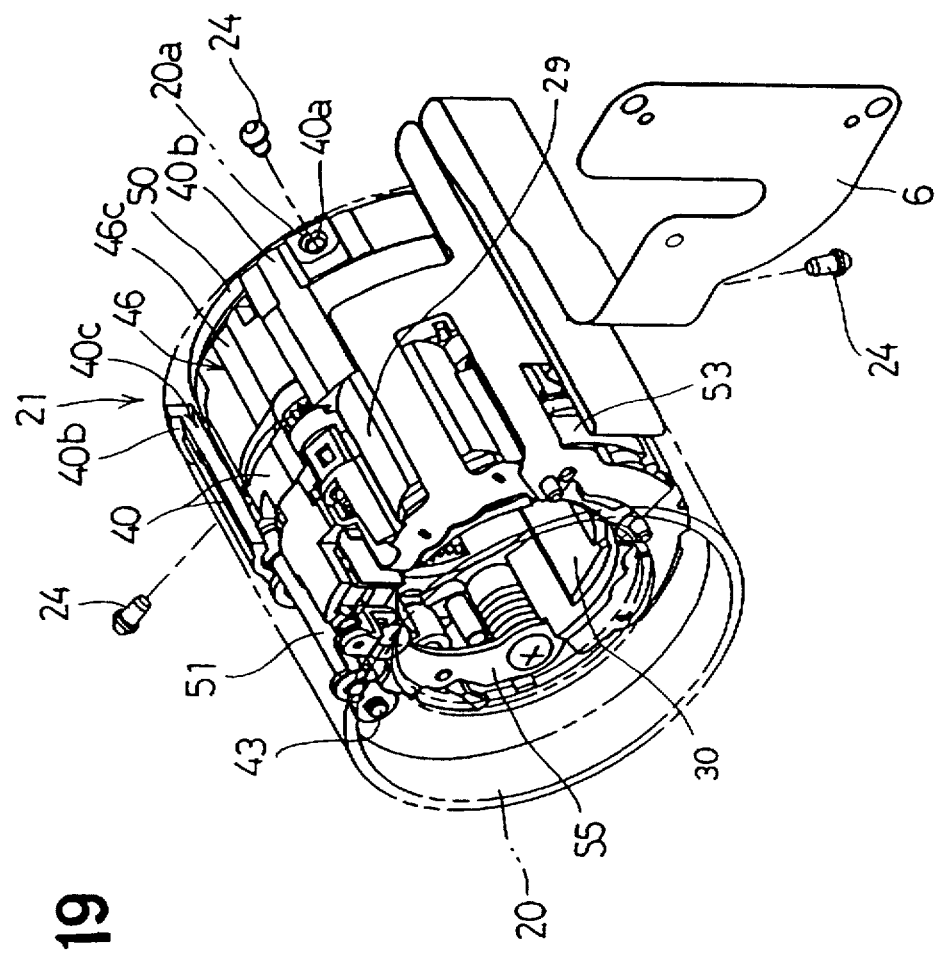
FIG. 19 is a schematic perspective view illustrating a state where an AF/AE shutter unit of the zoom lens barrel is mounted to first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 19. In FIG. 19 the first moving barrel 20 is indicated by phantom lines. The follower pins 24 may be fixed by an adhesive, or the pins 24 may be formed as screws to be screwed into the fixing holes 40a.

Figure 1:
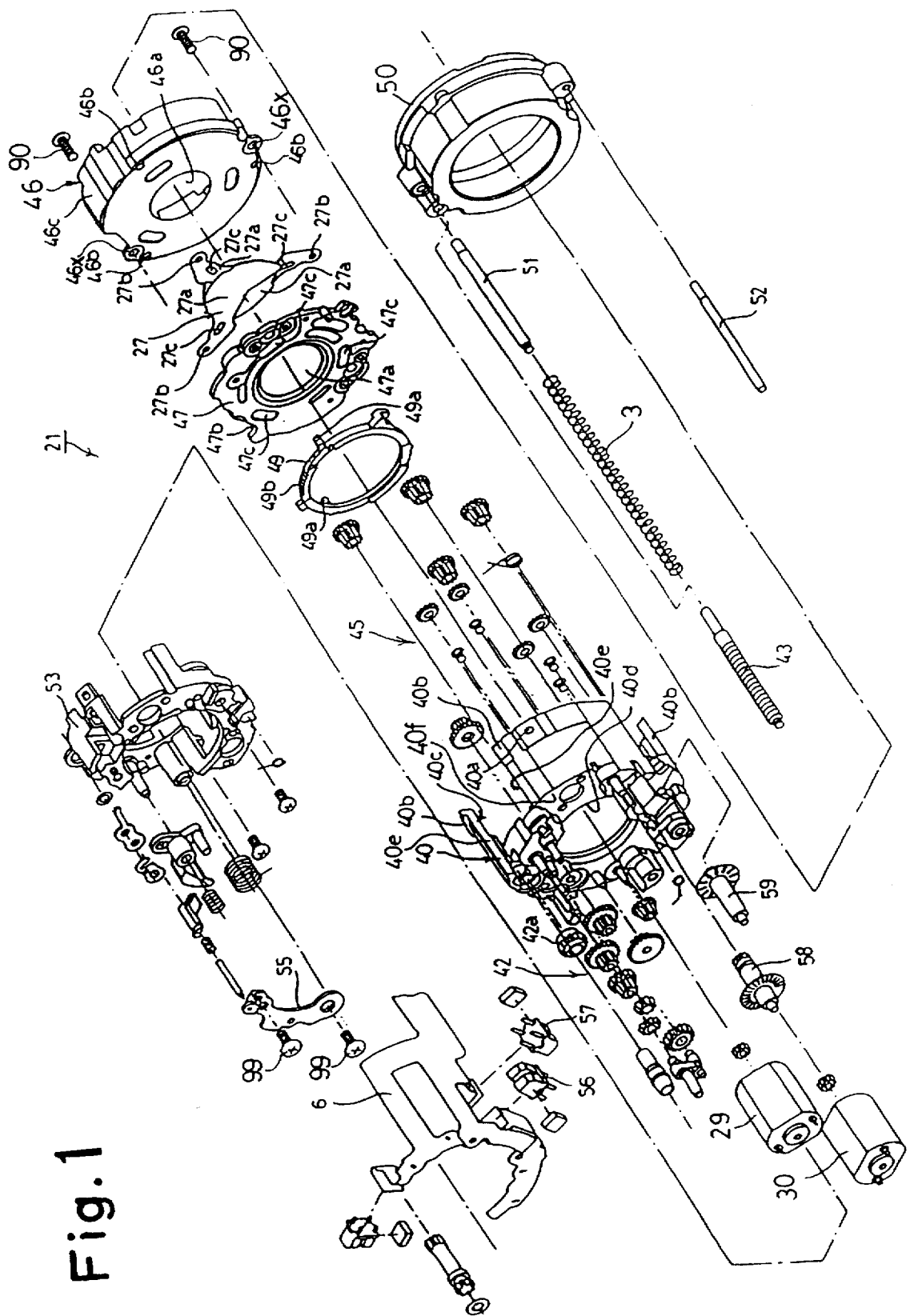
FIG. 1 an exploded perspective view of main parts of an AF/AE shutter unit provided in a zoom lens barrel of the present embodiment.
Figure 2:
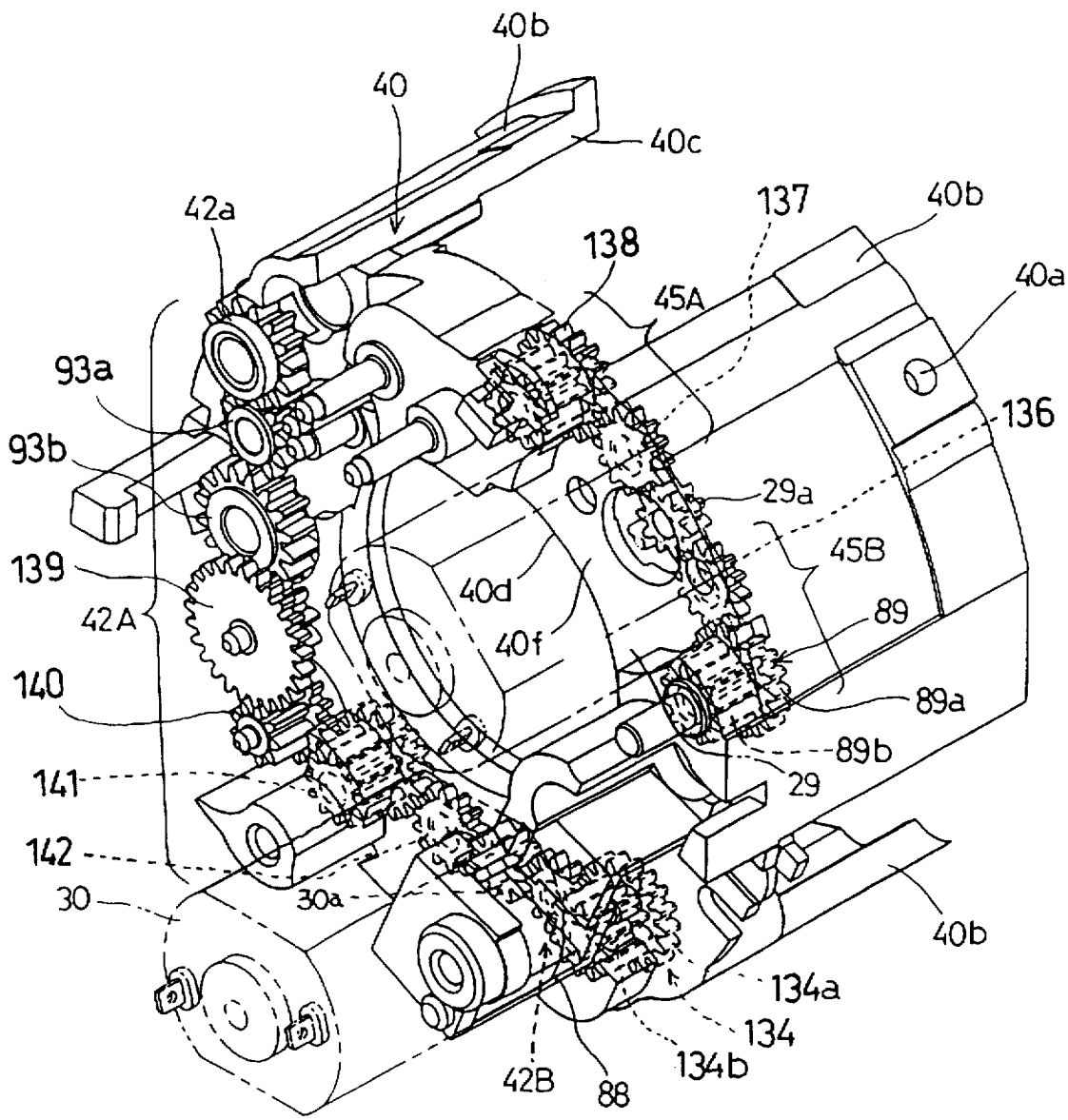
FIG. 2 a perspective view of a part of the AF/AE shutter unit, showing an arrangement of gears supported on the AF/AE shutter unit.

As illustrated in FIGS. 1 and 26, the AF/AE shutter unit 21 is provided with the shutter mounting stage 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. On the shutter mounting stage 40, the lens supporting barrel 34, the AE motor 29, and the rear lens group driving motor 30, are supported. The shutter mounting stage 40 is provided with an annular member 40f having an circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

An encoder 122 (rear lens group driving motor encoder) for detecting whether the rear lens group driving motor 30 is rotating and for detecting an amount of rotation of the rear lens group driving motor 30 consists of a photointerrupter 57 and a rotating disk 59. With this encoder the position of the lens supporting barrel 50 relative to the shutter mounting stage 40, i.e., the position of the rear lens group L2 relative to the first lens group L1 in the optical axis O, can be detected. An AE motor encoder 121 for detecting whether the AE motor 29 is rotating and for detecting an amount of rotation of the AE motor 29 consists of a photointerrupter 56 and a rotating disk 58. With this encoder the size of a diaphragm formed by the shutter 27 and whether the shutter 27 is open or closed can be detected.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 1, the shutter blade supporting ring 46 is provided at a front end thereof with a circular aperture 46a and with three arc grooves 46e and three supporting holes 46b positioned at even angular intervals around the circular aperture 46a. The arc grooves 46e are each located along a common circle having a center coincident with the optical axis O. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 1) at respective positions opposite the three supporting holes 46b. Each shutter blade 27a is provided at one end thereof with a hole 27b into which the corresponding pivotal shaft 47b is inserted, so that each shutter blade 27a is rotatable about the Corresponding pivotal shaft 47b. The major part of each shutter blade 27a, that extends normal to the optical axis O from the pivoted end, is formed as a light interceptive portion. All three light interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light interceptive portion thereof, with a slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, is provided with a female thread hole (not shown) at the axial center thereof and is restricted to move in the axial direction. A screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21 and the like are assembled, the aperture plate 23 is fixed to the rear of the linear guide barrel 17, and an annular retaining member 33 is fixed at the front of the fixed lens barrel block 12.

As shown in FIG. 26, the aforementioned barrier apparatus 35 includes a pair of trailing barrier blades 48a and a pair of leading barrier blades 48b for opening or closing a photographic aperture in front of the front lens group L1. An annular plate 96 is fixed on a rear surface of the decorative plate 41 with the pairs of trailing and leading barrier blades 48a, 48b being rotatably held therebetween about the optical axis O.

A barrier driving ring 97 is rotatably held between the inner flange 20b of the first moving barrel 20 and the annular plate 96 about the optical axis O. The barrier driving ring 97 is provided with a pair of barrier levers 98a and 98b. The barrier driving ring 97 is rotated in a forward or a rearward rotational direction upon receiving a rotation of the rear lens group driving motor 30 through a relay gear 92, to thereby open or close the pair of leading and trailing barrier blades 48b, 48a through the pair of barrier levers 98a and 98b.

A driving mechanism for driving the lens shutter 27, the rear lens group L2, etc. of the zoom lens barrel 10 of the present embodiment will be hereinafter discussed in detail with reference to FIGS. 1 through 15.

The AE motor 29, the rear lens group driving motor 30, the AE motor encoder 121, and the rear lens group driving motor encoder 122 are components of the driving mechanism.

The AE motor 29 and the rear lens group driving motor 30 are each mounted on the shutter mounting stage 40 with a rotating shaft thereof extending in the optical axis direction. Driving pinions 29a and 30a are respectively fixed on the rotating shafts of the AE motor 29 and the rear lens group driving motor 30.

Figure 3:
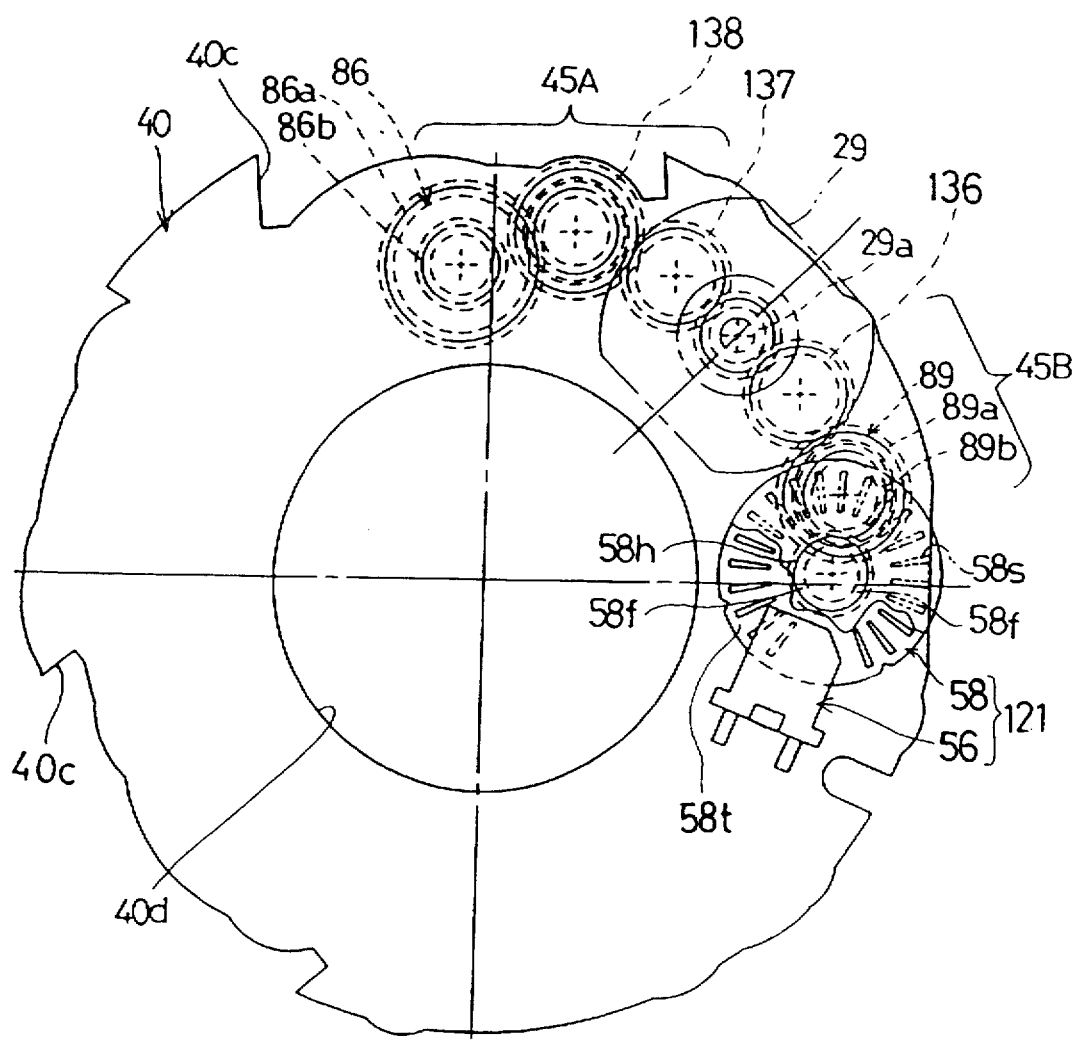
FIG. 3 is a front elevational view of a part of the AF/AE shutter unit, showing an arrangement of an AE motor and an AE encoder.
Figure 4:
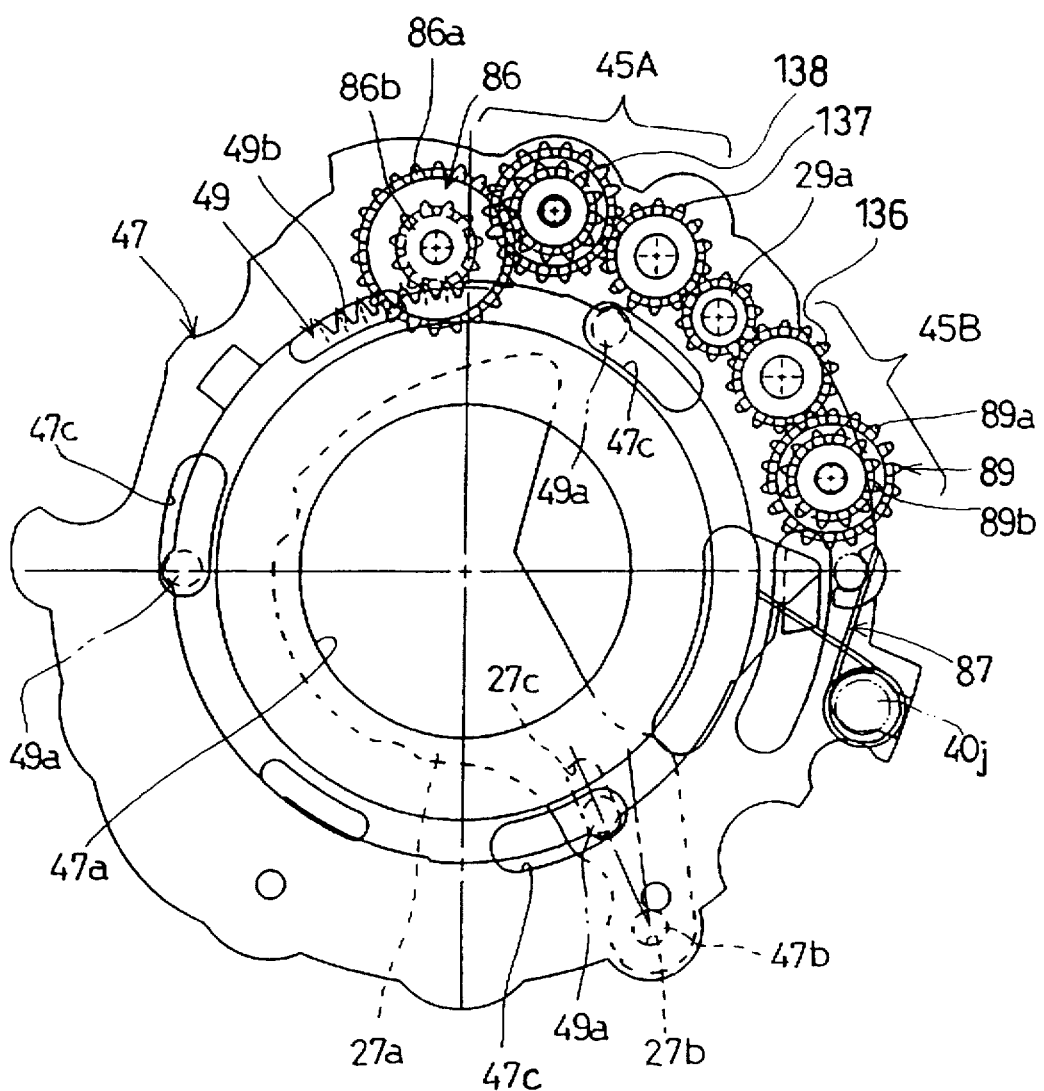
FIG. 4 is a front elevational view of a part of the AF/AE shutter unit, showing a lens shutter being fully is closed.
Figure 5:
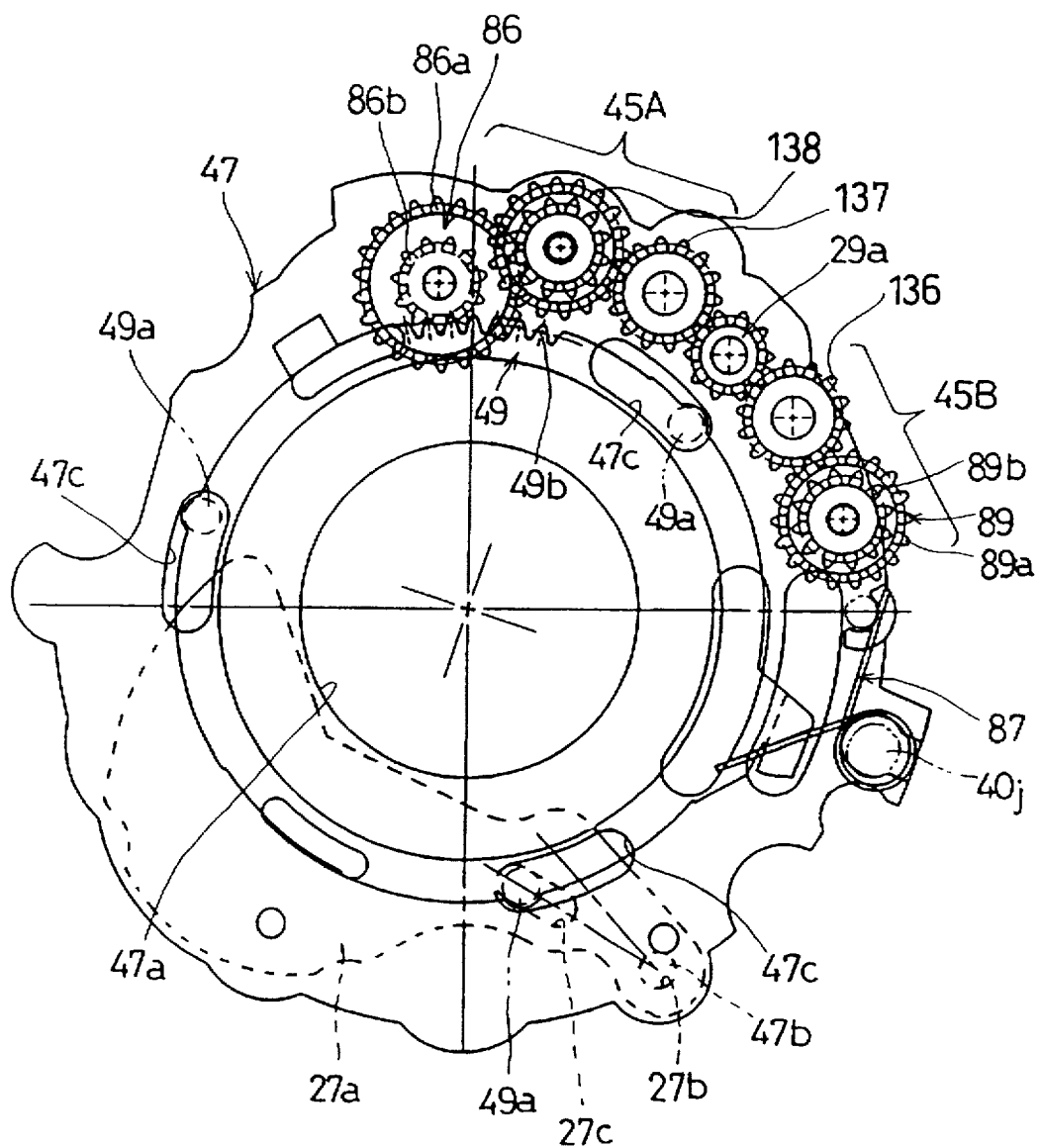
FIG. 5 is a front elevational view of the part of the AF/AE shutter unit shown in FIG. 4, showing the lens shutter being fully opened.

The driving mechanism further includes an AE gear train 45A and a first encoder gear train 45B (see FIGS. 3, 4 and 5). The AE gear train 45A includes a spur gear 137, which meshes with the driving pinion 29a, and composite gears 86, 138. The first encoder gear train 45B includes a spur gear 136, which meshes with the driving pinion 29a, and a composite gear 89. The driving pinion 29a is located between the AE gear train 45A and the first encoder gear train 45B. The driving pinion 29a, the AE gear train 45A and the first encoder gear train 45B are positioned along a circumferential direction of the AF/AE shutter unit 21.

Figure 6:
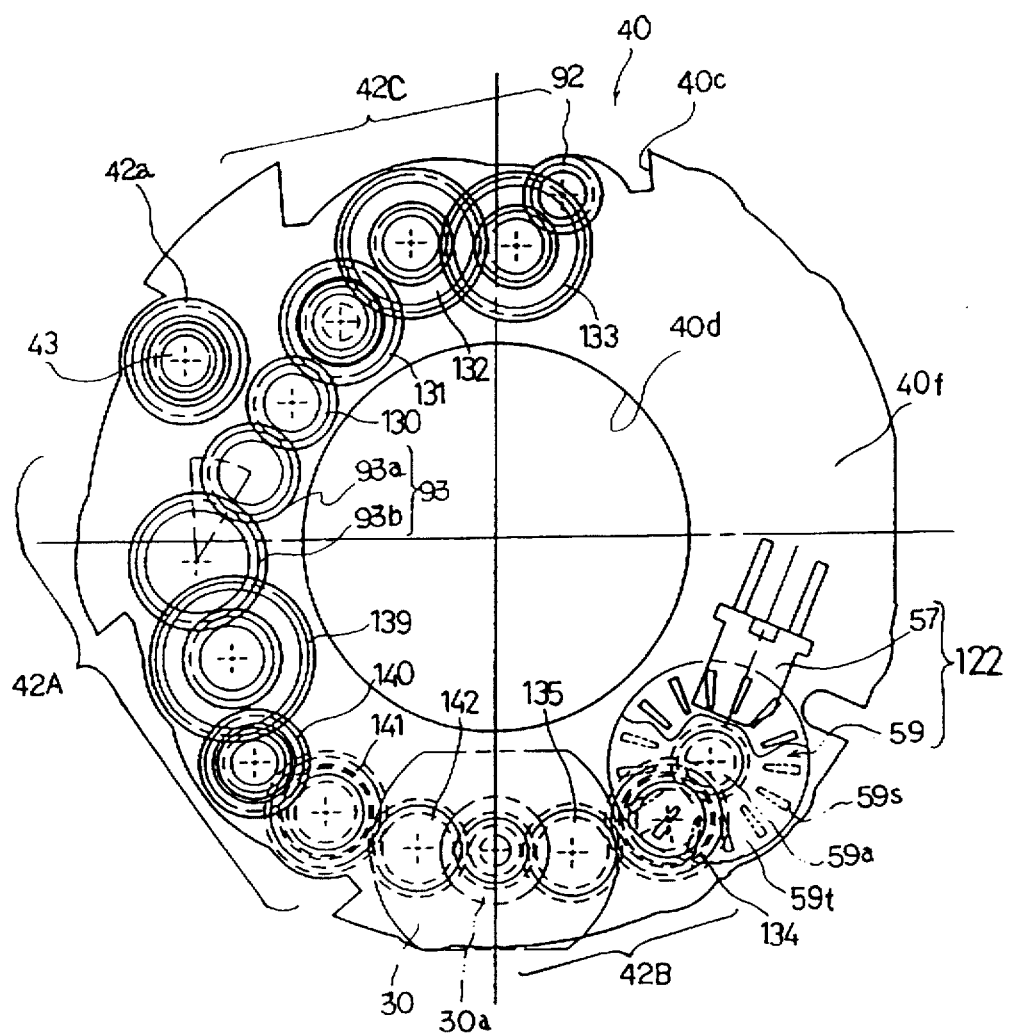
FIG. 6 is a front elevational view of a part of the AF/AE shutter unit, showing an arrangement of a rear lens group driving motor and a rear lens group driving motor encoder.
Figure 7:
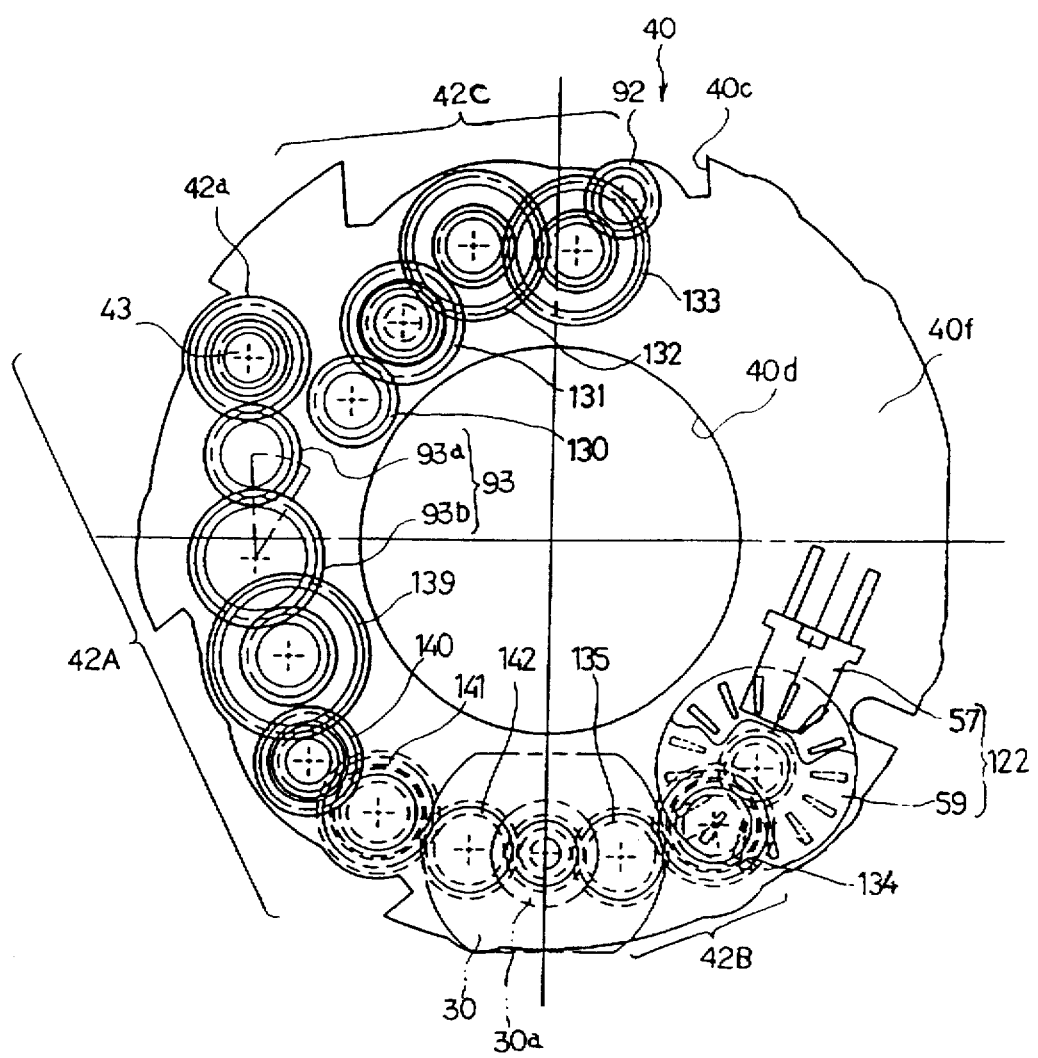
FIG. 7 is a front elevational view of the part of the AF/AE shutter unit shown in FIG. 6 in a different state.

The driving mechanism further includes a rear lens group driving gear train 42A, a second encoder gear train 42B and a barrier driving gear train 42C (see FIGS. 6 and 7). The rear lens group driving gear train 42A includes a spur gear 142, which meshes with the driving pinion 30a, composite gears 139, 140, 141, and a planetary gear 93 consisting of a sun gear 93b and a planet gear 93a. The second encoder gear train 42B includes a spur gear 135, which meshes with the driving pinion 30a, and a composite 9ear 134. The driving pinion 30a is located between the rear lens group driving gear train 42A and the second encoder gear train 42B. The driving pinion 30a, the rear lens group driving gear train 42A and the second encoder gear train 42B are positioned along a circumferential direction of the AF/AE shutter unit 21. The barrier driving gear train 42C includes a spur gear (input gear) 130, which is able to mesh with the planet gear 93a, and composite gears 131, 132, 133.

It will be appreciated from the foregoing that the rotation of the AE motor 29 is transmitted to both the shutter 27 and the AE motor encoder 121 through the AE gear train 45A and the first encoder gear train 45B, respectively, and that the rotation of the rear lens group driving motor 30 is transmitted to both the aforementioned feed screw mechanism for moving the rear lens group L2 along the optical axis O and the rear lens group driving motor encoder 122 through the rear lens group driving gear train 42A and the second encoder gear train 42B, respectively.

The AE motor encoder 121 is provided to control the exposure of the shutter 27 driven by a rotation of the AE motor 29. The AE motor encoder 121 detects whether the AE motor 29 is rotating and also detects an amount of rotation of the AE motor 29 by counting the number of pulses of light generated by the rotating disk 58 and the photointerrupter 56. The rotating disk 58 is provided with a plurality of radially formed slits 58s formed at even angular intervals. Each of the radially formed slits 58s extends in a radial direction of the rotating disk 58. A light-intercepting portion 58t is formed between two adjacent slits 58s on the rotating disk 58. Accordingly, the slits 58s and the light-intercepting portions 58t are alternately formed at even angular intervals on the rotating disk 58.

The rear lens group driving motor encoder 122 is provided to control the movement of the rear lens group L2 driven by a rotation of the rear lens group driving motor 30. The rear lens group driving motor encoder 122 detects whether the rear lens group driving motor 30 is rotating and also detects an amount of rotation of the rear lens group driving motor 30 by counting the number of pulses of light generated by the rotating disk 59 and the photointerrupter 57. The rotating disk 59 is provided with a plurality of slits 59s formed at even angular intervals. Each of the slits 59s extends in a radial direction of the rotating disk 59. A light-intercepting portion 59t is formed between two adjacent slits 59s on the rotating disk 59. Accordingly, the slits 59s and the light-intercepting portions 59t are alternately formed at even angular intervals on the rotating disk 59.

Figure 11:
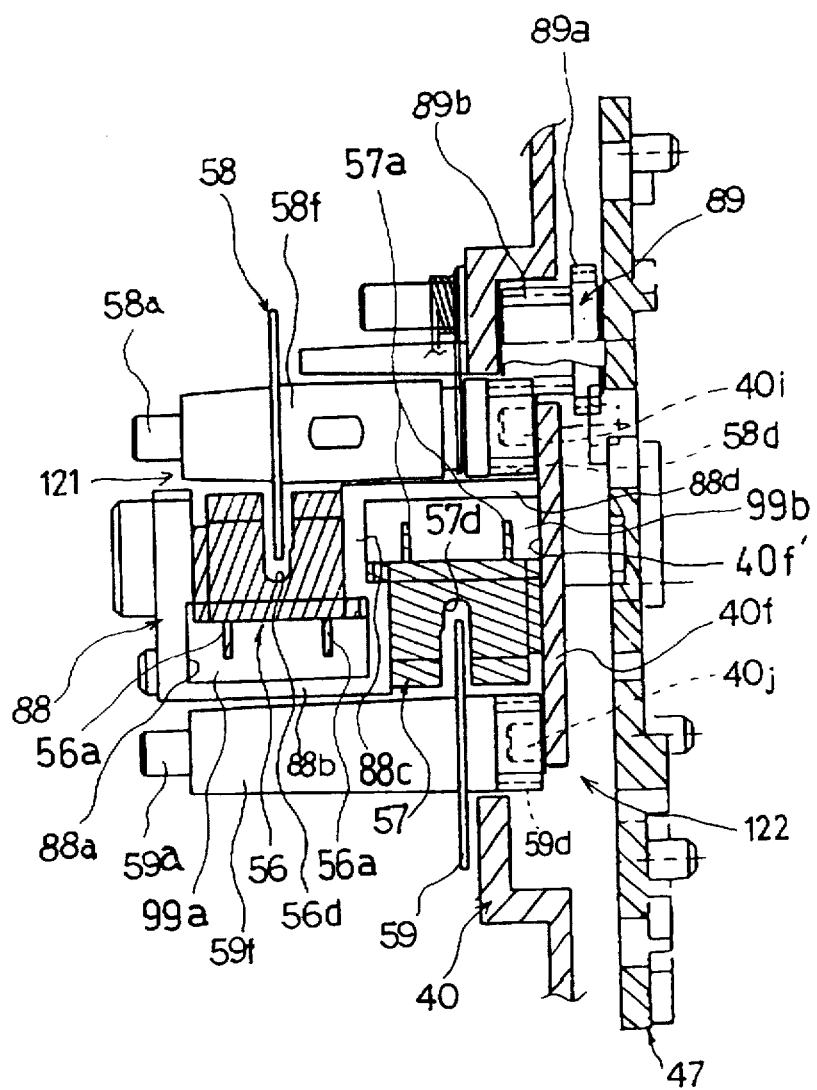
FIG. 11 is a sectional view of a part of the AF/AE shutter unit, showing an arrangement of the AE motor encoder and the rear lens group driving motor encoder.
Figure 12:
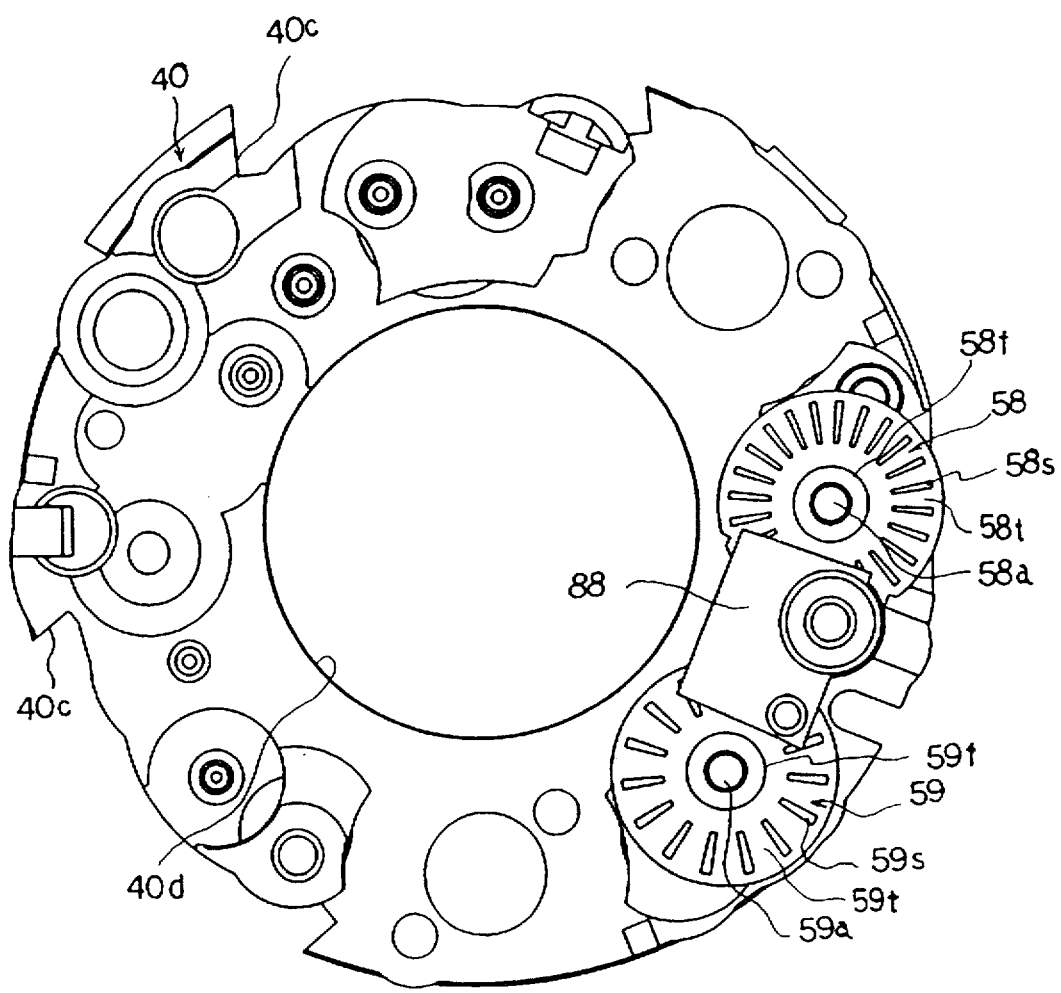
FIG. 12 is a front elevational view of a part of the AF/AE shutter unit, showing an arrangement of the AE motor encoder and the rear lens group driving motor encoder.
Figure 13:
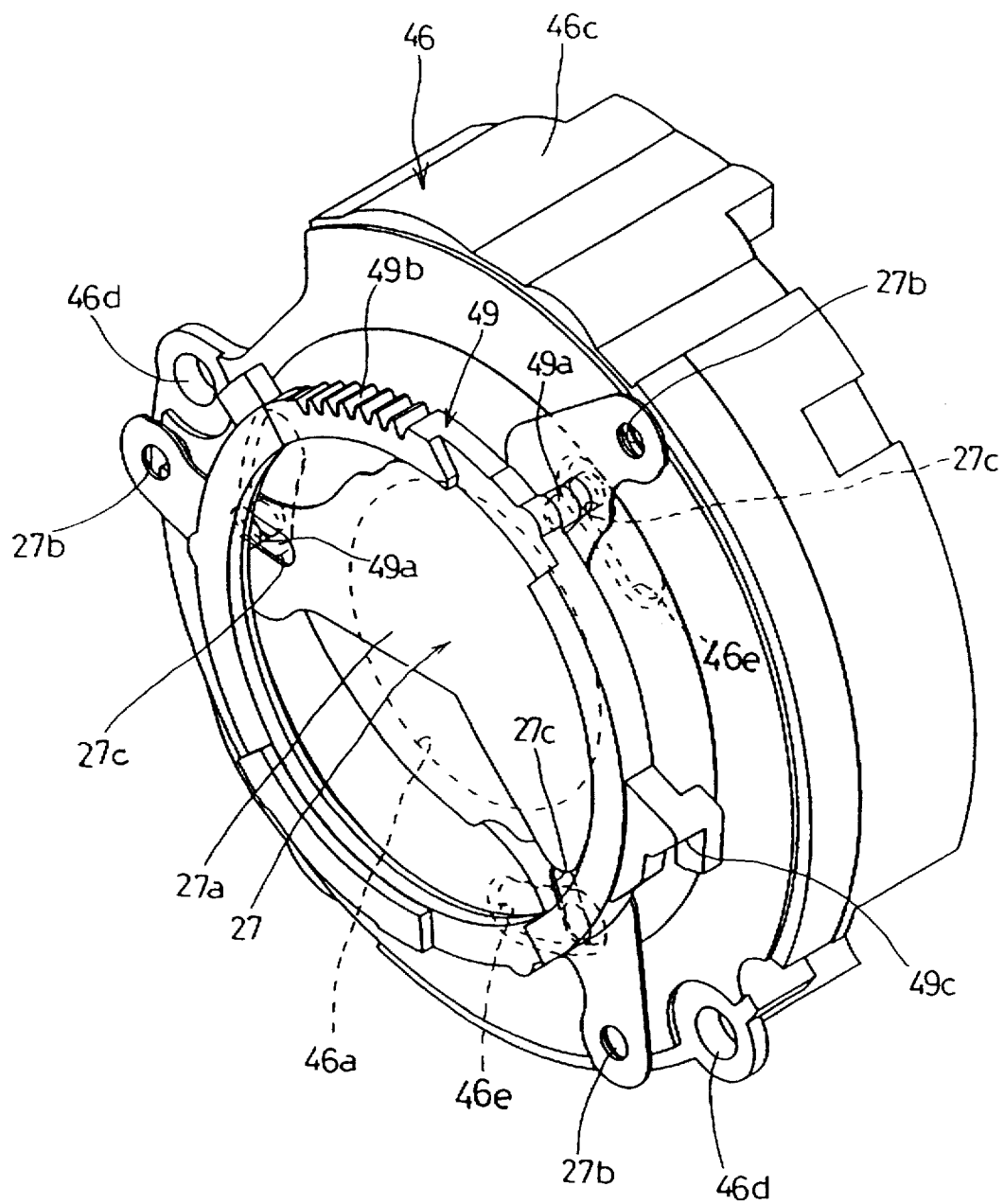
FIG. 13 is a perspective view of a part of the AF/AE shutter unit, showing the lens shutter and peripheral members thereof.
Figure 14:
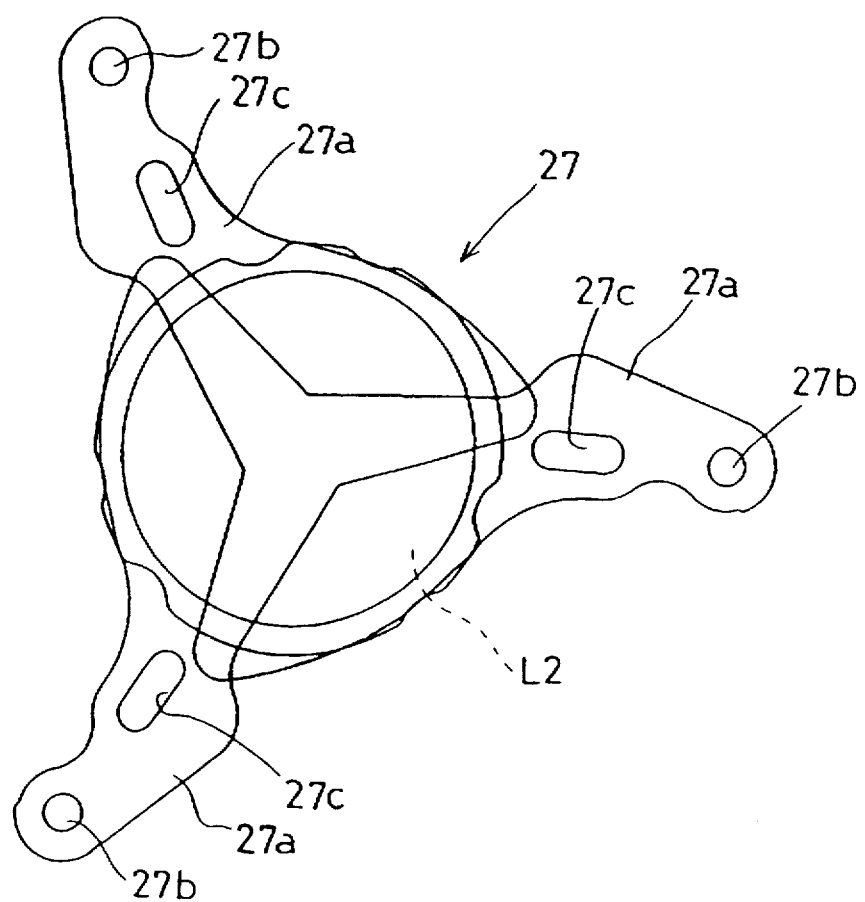
FIG. 14 is a front elevational view of the lens shutter in a full closed state.
Figure 15:
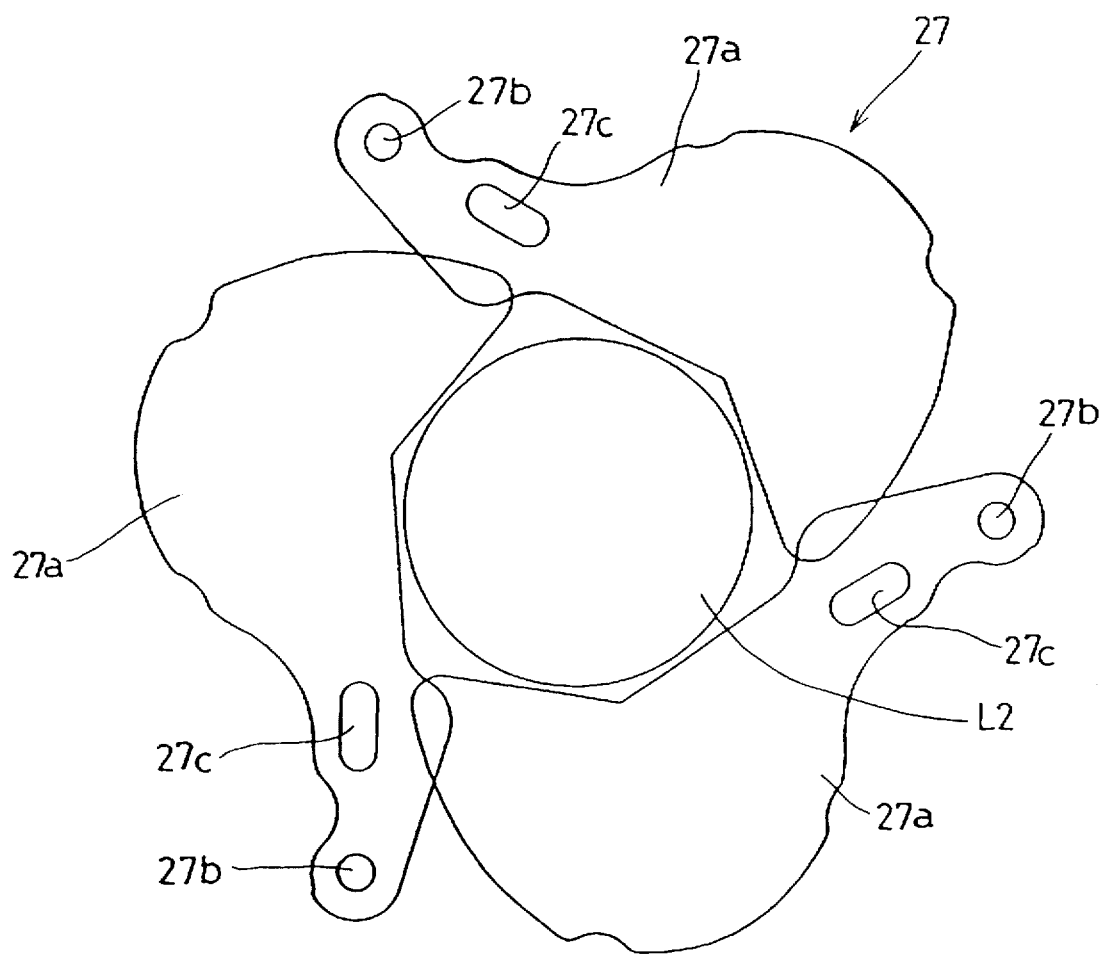
FIG. 15 is a front elevational view of the lens shutter in a full opened state.

As clearly shown in FIG. 11, the AE motor encoder 121 and the rear lens group driving motor encoder 122 are positioned on the AF/AE shutter unit 21 adjacent to each other, with the photointerrupter 56 overlapping the photointerrupter 57 as viewed in the optical axis direction. The rotating disks 58, 59 are also positioned close to each other. The rotating disks 58, 59 are positioned adjacent to each other between the AE motor 29 and the rear lens group driving motor 30, as clearly shown in FIGS. 8 or 9.

Figure 8:
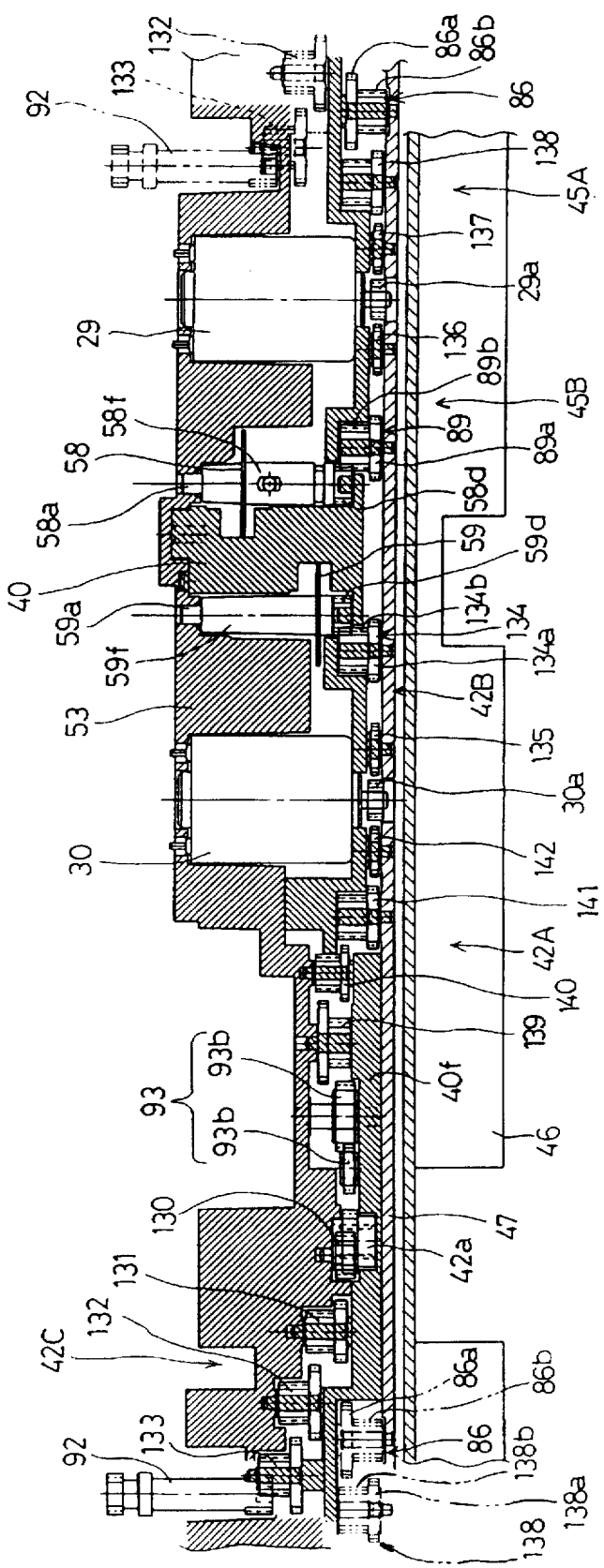
FIG. 8 is a developed view of a part of the AF/AE shutter unit, showing the AE motor and the rear lens group driving motor, gear trains driven by those motors, a shutter mounting stage by which the motors and the gear trains are supported, and some other peripheral members thereof.
Figure 9:
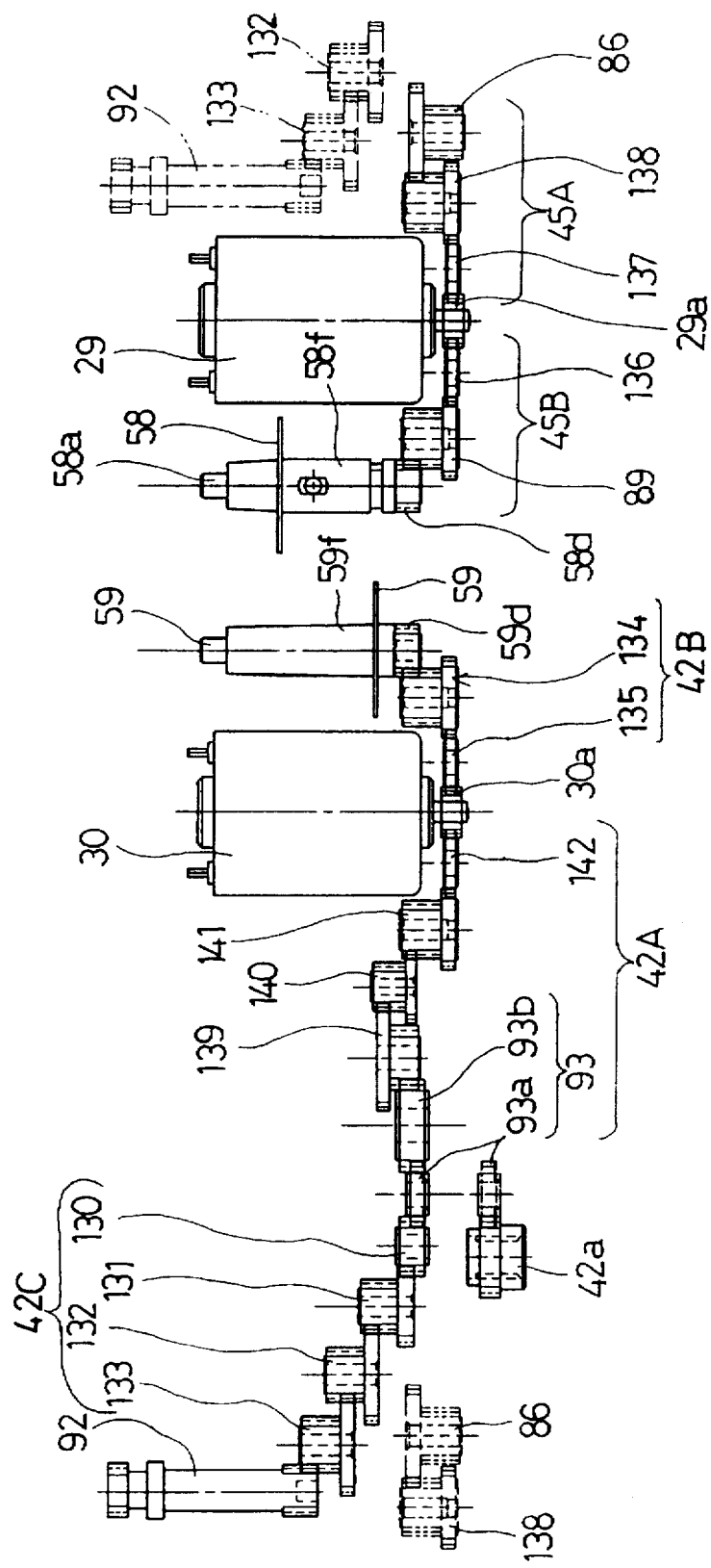
FIG. 9 is a developed view of the part of the AF/AE shutter unit shown in FIG. 8, showing only the motors and the gear trains therein.
Figure 10:
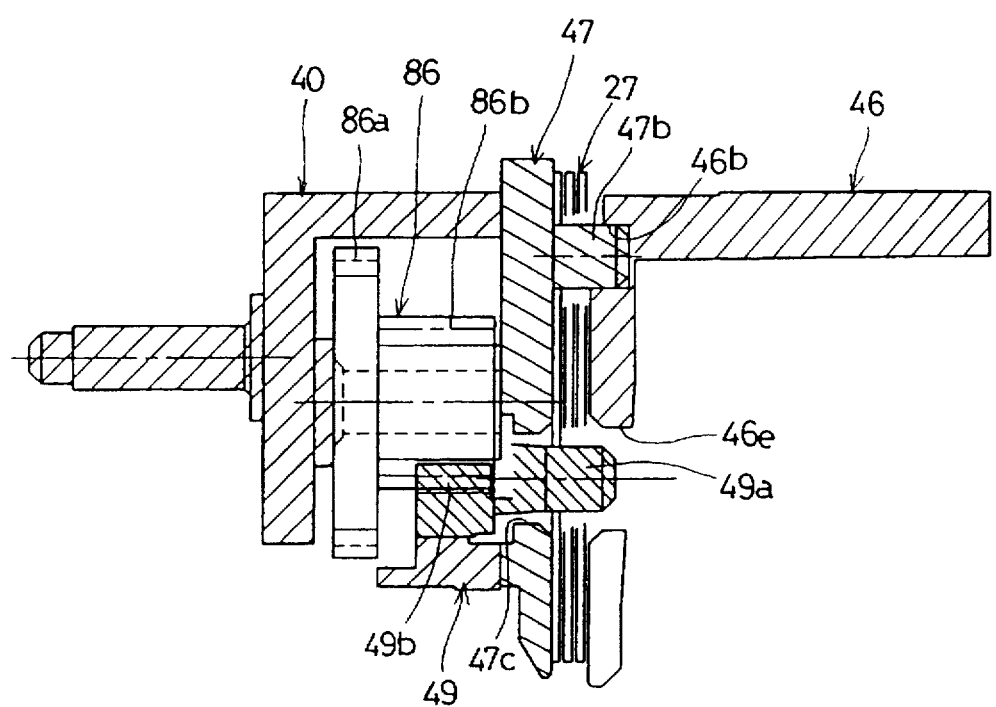
FIG. 10 is a sectional view of a part of the AF/AE shutter unit.

As shown in FIGS. 8 and 9, the AE gear train 45A, the first encoder gear train 45B, the rear lens group driving gear train 42A and the second encoder gear train 42B are not located in a common plane perpendicular to the optical axis O. The rotation of the rear lens group driving motor 30 is transmitted through two different gear trains, i.e., the rear lens group driving gear train 42A and the second encoder gear train 42B. Several gears (i.e., gears 141, 142) of the rear lens group driving gear train 42A are located behind the annular member 40f and the remaining gears (i.e., gears 93a, 93b, 139, 140) of the rear lens group driving gear train 42A are located in front of the annular member 40f. The second encoder gear train 42B is located behind the annular member 40f. The final gear (i.e., planet gear 93a) of the rear lens group driving gear train 42A meshes with either the driving gear 42a or the spur gear 130 of the barrier driving gear train 42C. The composite gear 133 meshes with the relay gear 92 which is rotated for opening or closing the pair of leading and trailing barrier blades 48b, 48a through the pair of barrier levers 98a and 98b.

As shown in FIGS. 1 and 8 or 9 the barrier driving gear train 42C is arranged in steps away from the shutter 27 in a forward direction. Composite gears 86, 138 of the AE gear train 45A are located behind the composite gears 132, 133, with the annular member 40f being positioned therebetween. Accordingly, the barrier driving gear train 42C (composite gears 132, 133) and the AE gear train 45A (composite gears 86, 138) are positioned to overlap each other as viewed from an object side or a film side in the optical axis direction.

As can be understood from the foregoing, the aforementioned drive mechanism transmits the rotation of the rear lens group driving motor 30 to either the driving gear 42a, which engages with the screw shaft 43 for moving the rear lens group L2 along the optical axis O, or the spur gear 130 of the barrier driving gear train 42C for opening or closing the barrier blades 48a, 48b, through the planetary gear 93. The planet gear 93a maintains connection with the driving gear 42a, as shown in FIG. 7, when the zoom lens barrel 10 is in a zooming range thereof ranging from the telephoto extremity to the wide extremity thereof. The planet gear 93a is disconnected from the driving gear 42a to be connected with the spur gear 130 as shown in FIG. 6 by a switching member 120 (see FIG. 1), when the zoom lens barrel 10 is in a moving range outside of the zooming range between the wide extremity and the most retracted position thereof. In the state shown in FIG. 6, rotations of the rear lens group driving motor 30 in forward and reverse directions cause the barrier driving ring 97 to rotate in forward and reverse rotational directions to thereby open and close the barrier blades 48a, 48b of the barrier apparatus 35, respectively. Conversely, in the state shown in FIG. 7, rotations of the rear lens group driving motor 30 in forward and reverse directions cause the driving gear 42a to rotate in forward and reverse rotational directions to thereby move the rear lens group L2 to move forward and rearward along the optical axis O relative to the front lens group L1 through the screw shaft 43, respectively.

The composite gear 89, which is the final gear of the first encoder gear train 45B, includes a large gear 89a and a small gear 89b which are integrally formed to have a common rotational center. The small gear 89b meshes with a spur gear 58d integrally formed on a rotational shaft 58f of the rotating disk 58 at a rear end thereof. The composite gear 86, which is the final gear of the AE gear train 45A, includes a large gear 86a and a small gear 86b which are integrally formed to have a common rotational center. The small gear 86b meshes with the gear portion 49b of the circular driving member 49 rotatably held between an annular member 40f and the supporting member 47 about the optical axis O (see FIGS. 4 and 10). The circular driving member 49 continues to be biased in a counterclockwise direction as viewed in FIG. 4 by a torsion spring 87 supported on a pin 40j formed on the rear surface of the annular member 40f. The composite gear 134, which is the final gear of the second encoder gear train 42B, includes a large gear 134a and a small gear 134b which are integrally formed to have a common rotational center. The small gear 134b meshes with a spur gear 59d integrally formed on a rotational shaft 59f of the rotating disk 59 at a rear end thereof.

As shown in FIG. 11, the AE motor encoder 121 and the rear lens group driving motor encoder 122 are arranged next to each other between the rotational shafts 58f, 59f with a partition 88 positioned between the encoders 121, 122. The partition 88 consists of four plates 88a, 88b, 88c and 88d integrally formed. The plates 88b and 88d are parallel to each other and each extend in the optical axis direction. The plates 88a and 88c are parallel to each other, perpendicular to the plates 88b and 88d. The plate 88b connects the plate 88a with the plate 88c, and the rear end of the plate 88d contacts the annular member 40f.

The partition 88 together with a corresponding part of the annular member 40f is formed to have a substantially "S" shape, as viewed in FIG. 11. The partition 88 together with a front wall 40f of the annular member 40f forms two divided spaces 99a, 99b in which the photointerrupters 56, 57 are respectively accommodated. The photointerrupters 56, 57 are positioned oppositely and fixed in the spaces 99a, 99b, with slits 56d, 57d of the photointerrupters 56, 57 facing in opposite directions toward the corresponding rotating disk 58 or 59 and with pairs of electrical terminals 56a, 57a facing in opposite directions toward the corresponding rotating disk 58 or 59. Due to this arrangement, the rotating disks 58, 59 and the photointerrupter 56, 57 are space-efficiently disposed without consuming much space in the AF/AE shutter unit 21. Each photointerrupter 56 or 57 is provided with a light emitter on one side of the slit and a light receiver on the other side of the slit.

The rotational shaft 58f of the rotating disk 58, which extends in the optical axis direction, is provided at front and rear ends thereof with a protrusion 58a and a round hole which are aligned, respectively. The protrusion 58a is rotatably supported by the holding member 53, and a protrusion 40i formed on the shutter mounting stage 40 is inserted in the round hole, so that the rotating disk 58 is rotatably supported about a center axis thereof parallel to the optical axis O. The rotating disk 58 is located in the slit 56d, so that the rotating disk 58 intermittently interrupts the light emitted from the light emitter of the photointerrupter 56 to the light receiver of the same when the rotating disk 58 rotates. Due to this intermittent interruption, the light receiver of the photointerrupter 56 receives pulses of light to thereby generate pulse signals. The pulse signals are electrically transmitted to the AE motor controller 66 through the flexible printed circuit board 6. The AE motor controller 66 is provided in a controller 75 (see FIG. 22) provided in the camera body. A CPU (not shown) serves as the controller 75 and also serves as the whole optical unit driving motor controller 60, the rear lens group driving motor controller 61, the object distance measuring apparatus 64, the photometering apparatus 65 and the AE motor controller 66. The zoom operating device 62 and the focusing operating device are each connected to the CPU.

The rotational shaft 59f of the rotating disk 59, which extends in the optical axis direction, is provided at front and rear ends thereof with a protrusion 59a and a round hole which are aligned, respectively. The protrusion 59a is rotatably supported by the holding member 53, and a protrusion 40j formed on the shutter mounting stage 40 is inserted in the round hole, so that the rotating disk 59 is rotatably supported about a center axis thereof parallel to the optical axis O. The rotating disk 59 is located in the slit 57d, so that the rotating disk 59 intermittently interrupts the light emitted from the light emitter of the photointerrupter 57 to the light receiver of the same when the rotating disk 59 rotates. Due to this intermittent interruption the light receiver of the photointerrupter 57 receives pulses of light to thereby generate pulse signals. The pulse signals are electrically transmitted to the rear lens group driving motor controller 61 through the flexible printed circuit board 6. The rear lens group driving motor controller 61 is provided in the controller 75.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens group.

In addition, in the above embodiment, the rear lens group L1 is provided as a component of the AF/AE shutter, unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner by making the rear lens group L2 a member separate from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

In the zoom lens camera of the present embodiment, the operation by rotation of the whole optical unit driving motor 25 and the rear lens group driving motor 30 will now be described with reference to FIGS. 22, 23, 24 and 25.

As shown in FIGS. 23 or 25, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 formed integral with the fixed lens barrel block 12, to thereby rotate the third moving barrel 16 in one predetermined rotational direction to advance forwardly along the optical axis O. Therefore, the second moving barrel 19 and the first moving barrel 20 are each advanced by a small amount in the optical axis direction, along with the third moving barrel 16. Consequently, the camera is in a state capable of photographing, with the zoom lens positioned at the widest position, i.e., the wide end. At this stage, due to the fact that the amount of movement of the linear guide barrel 17, with respect to the fixed lens barrel block 12, is detected through the relative slide between the code plate 13a, and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16b. Therefore, the third moving barrel 16 is advanced from the fixed lens barrel block 12 according to the relationship between the female helicoid 12a and the male helicoid 16a. At the same time, the linear guide barrel 17 moves forwardly in the optical axis direction together with the third moving barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation to the fixed lens barrel block 12, due to the above-noted structures in which the first moving barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, like the case of advancing driving as above described, the rear lens group driving motor 30 is not driven.

Figure 22:
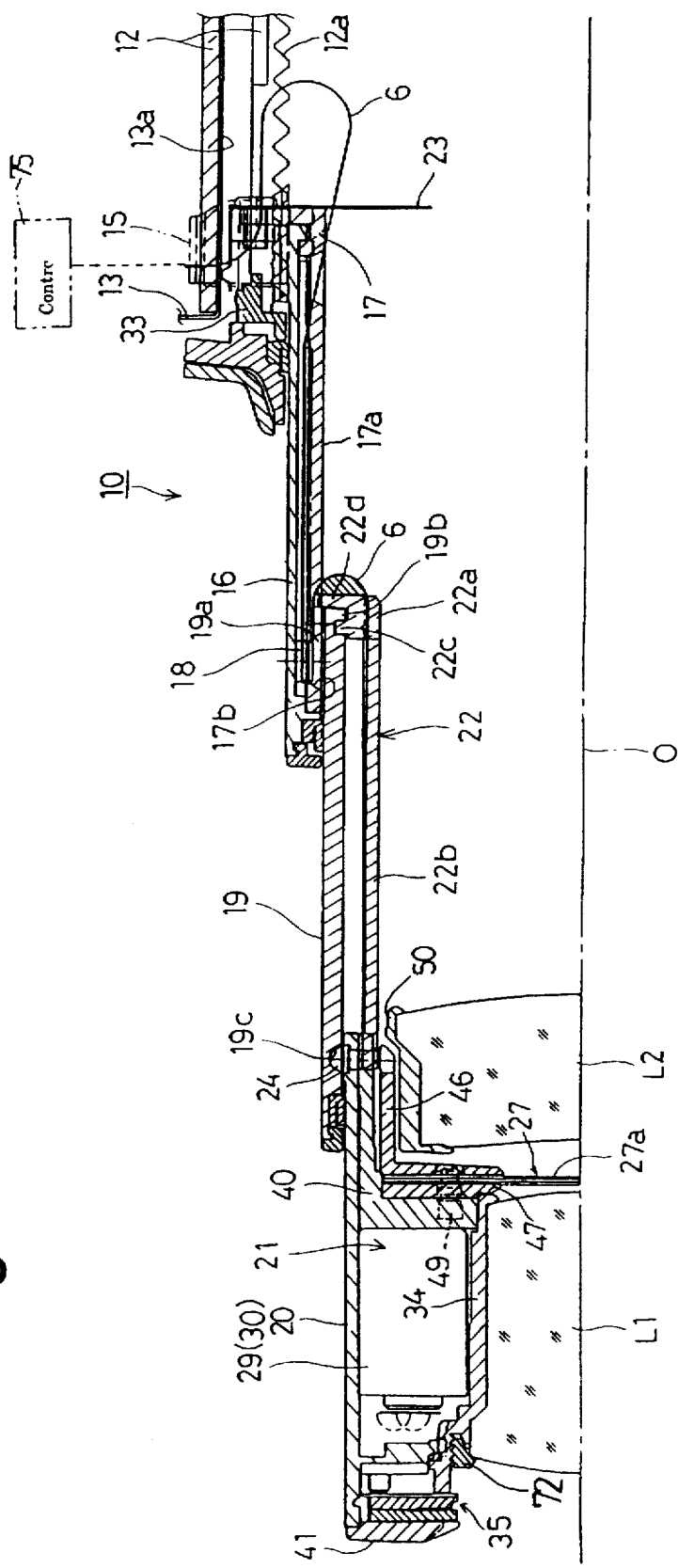
FIG. 22 is a sectional view of an upper part of the zoom lens barrel in a maximum extended state.
Figure 24:
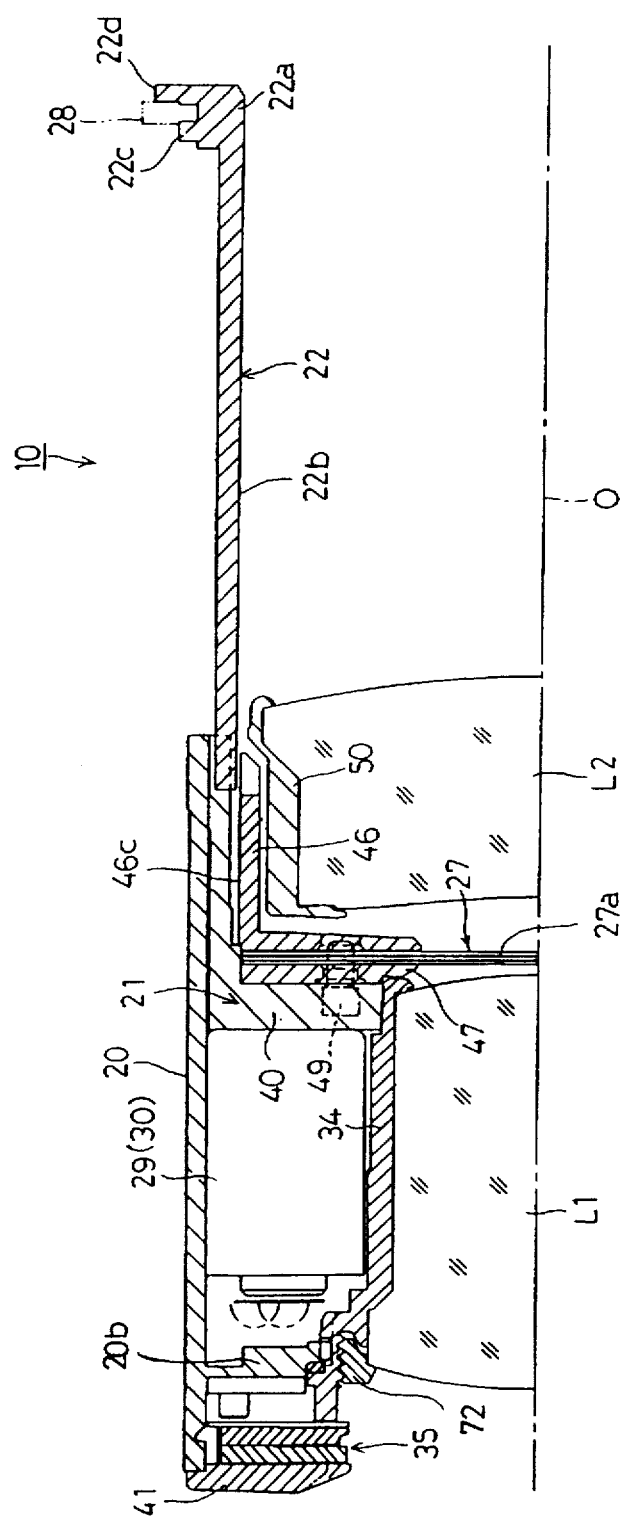
FIG. 24 is a sectional view of the upper part of the zoom lens barrel shown in FIG. 23 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other, as shown in FIGS. 22 or 24. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time the photometering apparatus 65 is actuated to measure a current subject brightness. Thereafter when the release button is fully depressed, the whole optical unit driving motor 25 and the rear lens group driving motor 30 are each driven by respective amounts dictated according to the focal length information set in advance and the subject distance information obtained from the object distance measuring apparatus 64 so that the front and rear lens groups L1 and L2 are respectively moved to specified positions to obtain a specified focal length to thereby bring the subject into focus. Immediately after the subject is brought into focus, via the AE motor controller 66, the AE motor 29 is driven to rotate the circular driving member 49 by an amount corresponding to the subject brightness information obtained from the photometering apparatus 65 so that the shutter 27 is driven to open the shutter blades 27a by a specified amount which satisfies the required exposure. Immediately after such a shutter release operation, in which the three shutter blades 27a are opened and subsequently closed, is completed, the whole optical unit driving motor 25 and the rear lens group driving motor 30 are both driven to move the front lens group L1 and the rear lens group L2 to the respective initial positions at which they were at prior to a shutter release.

In the present embodiment of the zoom lens barrel 10, "Fantas Coat SF-6" is used as the coating 72e. However, a different type of coating may be used as the coating 72e as long as it is waterproof and makes the circular abutting surface 72b a smooth surface to form substantially no gap between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A lens drive mechanism, comprising:
   a shutter block which supports a lens shutter including a plurality of shutter, said shutter block blades;
   a lens group guided along an optical axis relative to said shutter block;
   a first motor secured to said shutter block for opening and closing said lens shutter;
   a second motor secured to said shutter block for moving said lens group along said optical axis;
   a first encoder for detecting a size of a diaphragm formed by said lens shutter;
   a second encoder for detecting an axial position of said lens group;
   a shutter driving gear train which connects said lens shutter with said first motor;
   a first encoder gear train which connects said first encoder with said first motor, said shutter driving gear train and said first encoder gear train being supported on said shutter block and arranged along a circumferential direction of said shutter block with a driving pinion of said first motor being positioned between said shutter driving gear train and said first encoder gear train;
   a lens driving gear train which connects said lens group with said second motor; and
   a second encoder gear train which connects said second encoder with said second motor, said lens driving gear train and said second encoder gear train being supported on said shutter block and arranged along said circumferential direction of said shutter block with a driving pinion of said second motor being positioned between said lens driving gear train and said second encoder gear train.

2. The lens drive mechanism according to claim 1, wherein said first encoder and said second encoder are adjacently positioned.

3. The lens drive mechanism according to claim 1, wherein said first encoder comprises a first photosensor and a first rotating disk associated with said first photosensor, and wherein said second encoder comprises a second photosensor and a second rotating disk associated with said second photosensor.

4. The lens drive mechanism according to claim 3, wherein each of said first and second photosensors is a photointerrupter.

5. The lens drive mechanism according to claim 3, wherein each of said first and second rotating disks is provided with a plurality of slits.

6. The lens drive mechanism according to claim 3, wherein said first rotating disk and said second rotating disk are positioned adjacent to each other between said first motor and said second motor.

7. The lens drive mechanism according to claim 3, wherein said first and second encoders are positioned to overlap each other as viewed in said direction of said optical axis.

8. The lens drive mechanism according to claim 3, wherein said first encoder gear train connects said first rotating disk with said first motor, and wherein said second encoder gear train connects said second rotating disk with said second motor.

9. The lens drive mechanism according to claim 1, further comprising a lens barrier for opening or closing a frontmost photographic aperture of said photographic lens, and a barrier driving gear train for selectively connecting said lens driving gear train with said lens barrier, wherein said barrier driving gear train is supported on said shutter block and arranged along said circumferential direction of said shutter block.

10. The lens drive mechanism according to claim 9, wherein said barrier driving gear train and said shutter driving gear train overlap each other as viewed in a direction of said optical axis.

11. The lens drive mechanism according to claim 10, further comprising a planetary gear including a sun gear and a planet gear which meshes with and revolves around said sun gear, wherein said sun gear continuously meshes with a final gear of said lens driving gear train and said planet gear meshes with either an input gear of said barrier driving gear train or a driving gear for moving said lens group along said optical axis.

12. The lens drive mechanism according to claim 11, further comprising a switch mechanism which switches said planet gear to mesh with either said driving gear or said input gear when said photographic lens is in a first or second photographable state, respectively.

13. The lens drive mechanism according to claim 12, further comprising a zoom lens, said zoom lens including a moving barrel which advances from or retracts into a stationary block of said zoom lens, wherein said switch mechanism causes said planet gear to mesh with either said driving gear or said input gear in accordance with said moving barrel being in or out of a moving range for zooming, respectively.

14. The zoom lens according to claim 13, wherein said zoom lens is a telescoping type of zoom lens having a plurality of concentrically arranged moving barrels, said moving barrel being a frontmost barrel of said plurality of moving barrels.

15. The zoom lens according to claim 13, further comprising another lens group fixed to said moving barrel and aligned with said lens group along said optical axis so that said lens group is movable along said optical axis relative to said another lens group.

16. A lens shutter type of camera, comprising:

a shutter block which supports a lens shutter;

a lens group guided along an optical axis relative to said shutter block;

a first motor secured to said shutter block for opening or closing said lens shutter;

a second motor secured to said shutter block for moving said lens group along said optical axis;

a shutter driving gear train which connects said lens shutter with said first motor;

a lens driving gear train which connects said lens group with said second motor;

a lens barrier for opening and closing a frontmost photographic aperture of said photographic lens; and a barrier driving gear train which connects said lens driving gear train with said lens barrier, wherein said shutter driving gear train, said lens driving gear train and said barrier driving gear train are supported on said shutter block and arranged along a circumferential direction of said shutter block, and wherein said barrier driving gear train and said shutter driving gear train overlap each other as viewed in a direction of said optical axis.

17. A lens shutter type of camera, comprising:

a shutter block which supports a lens shutter, said lens shutter including a plurality of shutter blades;

a lens group guided along an optical axis relative to said shutter block;

a first motor secured to said shutter block for opening and closing said lens shutter;

a second motor secured to said shutter block for moving said lens group along said optical axis;

a first encoder for detecting a size of a diaphragm formed by said lens shutter; and a second encoder for detecting an axial position of said lens group, wherein said first encoder and said second encoder are positioned adjacent to each other, and disposed between said first motor and said second motor.

18. The lens shutter type of camera according to claim 17, wherein said first encoder comprises a first photosensor and a first rotating disk associated with said first photosensor, wherein said second encoder comprises a second photosensor and a second rotating disk associated with said second photosensor, and wherein said first photosensor and said second photosensor are positioned between said first rotating disk and said second rotating disk.

19. A photographic zoom lens having a moving barrel advanced from and retracted into a stationary block of said photographic zoom lens, front and rear lens group positioned in said moving barrel, and an electrical unit fixed within said moving barrel said electrical unit assembled separately from said moving barrel, wherein said electrical unit comprises:

a lens shutter having a plurality of shutter blades;

a rear lens group supporting member which supports said rear lens group to be guided along an optical axis relative to said front lens group;

a first motor for opening and closing said lens shutter;

a second motor for moving said rear lens group supporting member along said optical axis;

a first encoder for detecting a size of a diaphragm formed by said lens shutter, said first encoder comprising a first photosensor and a first rotating disk associated with said first photosensor;

a second encoder for detecting an axial position of said rear lens group, said second encoder comprising a second photosensor and a second rotating disk associated with said second photosensor;

a shutter driving gear train which connects said lens shutter with said first motor;

a first encoder gear train which connects said first rotating disk with said first motor, said shutter driving gear train and said first encoder gear train being supported on said electrical unit and arranged along a circumferential direction of said electrical unit, and a driving pinion of said first motor being positioned between said shutter driving gear train and said first encoder gear train;

a lens driving gear train which connects said rear lens group with said second motor;

a second encoder gear train which connects said second rotating disk with said second motor, said lens driving gear train and said second encoder gear train being supported on said electrical unit and arranged along said circumferential direction of said electrical unit, and a driving pinion of said second motor being positioned between said lens driving gear train and said second encoder gear train;

a lens barrier including a plurality of barrier blades for opening or closing a front most photographic aperture of said photographic lens; and a barrier driving gear train which connects said lens driving gear train with said lens barrier, said barrier driving gear train being supported on said shutter block and arranged along said circumferential direction of said shutter block, wherein said barrier driving gear train and said shutter driving gear train overlap each other as viewed in a direction of said optical axis.

* * * * *